(12) United States Patent
Honda et al.

(10) Patent No.: US 12,212,647 B2
(45) Date of Patent: Jan. 28, 2025

(54) COMMUNICATION APPARATUS

(71) Applicant: DENSO CORPORATION, Kariya (JP)

(72) Inventors: Yoshimitsu Honda, Kariya (JP);
Shinsuke Kume, Kariya (JP)

(73) Assignee: DENSO CORPORATION, Kariya (JP)

( * ) Notice: Subject to any disclaimer, the term of this patent is extended or adjusted under 35 U.S.C. 154(b) by 551 days.

(21) Appl. No.: 17/667,730

(22) Filed: Feb. 9, 2022

(65) Prior Publication Data

US 2022/0239460 A1 Jul. 28, 2022

Related U.S. Application Data

(63) Continuation of application No. PCT/JP2020/031820, filed on Aug. 24, 2020.

(30) Foreign Application Priority Data

Aug. 30, 2019 (JP) .................................. 2019-158359

(51) Int. Cl.
*H04L 7/00* (2006.01)
*H03K 5/12* (2006.01)
(Continued)

(52) U.S. Cl.
CPC ............. *H04L 7/0033* (2013.01); *H03K 5/12* (2013.01); *H03K 17/687* (2013.01); *H04L 7/02* (2013.01)

(58) Field of Classification Search
CPC .... H03K 5/12; H03K 17/687; H03K 19/0175; H04L 7/0033; H04L 7/02; H04L 25/02
See application file for complete search history.

(56) References Cited

U.S. PATENT DOCUMENTS 9,502,955 B2 * 11/2016 Ohashi ................. H03K 17/162
9,705,697 B1    7/2017 Tomita et al.
(Continued)

FOREIGN PATENT DOCUMENTS

CN    100380798 C  * 4/2008  ............ H02M 1/088
CN    108809059 A  * 11/2018  ........... H02H 7/1227
(Continued)

OTHER PUBLICATIONS

Google Patents translated document of JP-2017041693-A (Year: 2017).*
(Continued)

*Primary Examiner* — Chi H Pham
*Assistant Examiner* — Vladislav Y Agureyev
(74) *Attorney, Agent, or Firm* — Posz Law Group, PLC

(57) ABSTRACT

A communication apparatus is one of a plurality of communication apparatuses included in a communication system where a first communication apparatus transmits data via a transmission path in synchronization with communication by a second communication apparatus. The communication apparatus includes a switching element setting a signal level on the transmission path to a dominant level by being turned on; a driving circuit driving the switching element. and a control circuit giving an on command that instructs the driving circuit to turn the switching element on in response to an edge at which a signal level on the transmission path changes from a recessive level to a dominant level being detected. The driving circuit or the control circuit is further configured to shorten a delay time from when the edge is detected to when the switching element is turned on.

7 Claims, 13 Drawing Sheets

(51) Int. Cl.
*H03K 17/687* (2006.01)
*H04L 7/02* (2006.01)

(56) References Cited

U.S. PATENT DOCUMENTS

| | | | | |
|---|---|---|---|---|
| 9,722,610 | B2* | 8/2017 | Akahane | H03K 17/04123 |
| 9,785,601 | B2* | 10/2017 | Mohammad | H03K 5/15 |
| 9,979,272 | B2* | 5/2018 | Tezuka | H03K 17/687 |
| 10,116,297 | B1* | 10/2018 | Wu | H03K 19/018507 |
| 10,483,977 | B1* | 11/2019 | Berwick | H03K 19/018521 |
| 10,547,309 | B2* | 1/2020 | Tezuka | H02M 7/48 |
| 10,734,892 | B2* | 8/2020 | Szczeszynski | H02M 3/1584 |
| 10,826,374 | B2* | 11/2020 | Song | H02M 3/158 |
| 2006/0158274 | A1* | 7/2006 | Self | H03L 7/04 331/107 SL |
| 2010/0176783 | A1* | 7/2010 | Tagome | H03K 17/04123 323/284 |
| 2010/0264976 | A1* | 10/2010 | Duby | H03K 5/08 327/333 |
| 2012/0068740 | A1* | 3/2012 | Sogabe | H03K 17/162 327/108 |
| 2012/0212251 | A1* | 8/2012 | Yanagishima | H03K 17/691 324/762.01 |
| 2012/0256585 | A1* | 10/2012 | Partovi | H01F 27/366 320/108 |
| 2012/0283146 | A1* | 11/2012 | Rothberg | G01N 33/54373 506/38 |
| 2014/0036988 | A1 | 2/2014 | Kashima et al. | |
| 2014/0300329 | A1* | 10/2014 | Thompson | H02M 3/156 327/79 |
| 2016/0020758 | A1* | 1/2016 | Kim | H03K 5/134 327/103 |
| 2016/0241227 | A1* | 8/2016 | Hirata | H01L 29/1608 |
| 2017/0264376 | A1 | 9/2017 | Tomita et al. | |
| 2017/0302151 | A1* | 10/2017 | Snook | H03K 17/063 |
| 2017/0310288 | A1* | 10/2017 | Das | H03F 1/305 |
| 2018/0083615 | A1* | 3/2018 | Kono | H02M 7/5387 |
| 2018/0083809 | A1* | 3/2018 | Tajalli | H03L 7/0995 |
| 2018/0331682 | A1* | 11/2018 | Duduman | H02M 1/38 |
| 2018/0343011 | A1* | 11/2018 | Tajalli | H03L 7/089 |
| 2019/0029678 | A1* | 1/2019 | Shelton, IV | A61B 18/1445 |
| 2019/0097738 | A1 | 3/2019 | Tomita et al. | |
| 2019/0140635 | A1* | 5/2019 | Abesingha | H03K 17/0822 |
| 2019/0288532 | A1* | 9/2019 | Mattos | H02J 7/0034 |
| 2019/0296727 | A1* | 9/2019 | Kruiskamp | H03K 17/063 |
| 2019/0319471 | A1* | 10/2019 | Kinzer | H01L 29/1033 |
| 2019/0327005 | A1 | 10/2019 | Tomita et al. | |
| 2020/0067553 | A1* | 2/2020 | Harada | H04B 1/38 |
| 2020/0092015 | A1 | 3/2020 | Tomita et al. | |
| 2020/0412231 | A1* | 12/2020 | Khamesra | H02M 1/32 |
| 2020/0412257 | A1* | 12/2020 | Rai | H02M 3/33538 |
| 2021/0058000 | A1* | 2/2021 | Ahmed | H02J 7/00 |

FOREIGN PATENT DOCUMENTS

| | | | | |
|---|---|---|---|---|
| CN | 110350902 A | * | 10/2019 | H03K 17/60 |
| CN | 117914323 A | * | 4/2024 | |
| EP | 2911324 A1 | * | 8/2015 | G06F 13/376 |
| JP | 2004241930 A | * | 8/2004 | |
| JP | 2017041693 A | * | 2/2017 | |
| JP | 2019213349 A | * | 12/2019 | |
| JP | 2020101891 A | * | 7/2020 | H03K 19/00384 |
| WO | WO-2017038592 A1 | * | 3/2017 | H03K 17/163 |
| WO | WO-2017149957 A1 | * | 9/2017 | H03K 17/16 |
| WO | WO-2017217139 A1 | * | 12/2017 | B60S 1/08 |
| WO | WO-2017222077 A1 | * | 12/2017 | B60K 37/00 |
| WO | WO-2019082273 A1 | * | 5/2019 | B60R 16/02 |

OTHER PUBLICATIONS

Rohm, [online], "CXPI Transceiver for Automotive: BD41000FJ-C", Rohm Semiconductor, Catalog No. 58F6937J, Internet URL: https://www.rohm.co.jp/documents/11401/3280383/58F6937J_CXPI-transceiver_ss_J.pdf, Sep. 2015 (and partial English translation).

* cited by examiner

COMMUNICATION APPARATUS

CROSS REFERENCE TO RELATED APPLICATIONS

The present application is a continuation application of International Patent Application No. PCT/JP2020/031820 filed on Aug. 24, 2020, which designated the U.S. and claims the benefit of priority from Japanese Patent Application No. 2019-158359 filed on Aug. 30, 2019. The entire disclosures of all of the above applications are incorporated herein by reference.

TECHNICAL FIELD

The present disclosure relates to a communication apparatus being one of a plurality of communication apparatuses included in a communication system in which one of the plurality of communication apparatuses transmits data via a transmission path in synchronization with communication by another one of the plurality of communication apparatuses.

BACKGROUND

There is known an in-vehicle communication method mounted on a vehicle, such as CXPI in which a slave transmits data in synchronization with the communication by a master. CXPI is an abbreviation for Clock Extension Peripheral Interface. There is disclosed a technology in such a communication, which speeds up the operation of the driver circuit when changing the signal level on the transmission path from a recessive level that is a signal level recessive on the transmission path to a dominant level that is a signal level dominant on the transmission path.

SUMMARY

According to an example of the present disclosure, a communication apparatus is provided as one of a plurality of communication apparatuses included in a communication system where a first communication apparatus transmits data via a transmission path in synchronization with communication by a second communication apparatus. The communication apparatus includes a switching element setting a signal level on the transmission path to a dominant level by being turned on; a driving circuit driving the switching element. and a control circuit giving an on command that instructs the driving circuit to turn the switching element on in response to an edge at which a signal level on the transmission path changes from a recessive level to a dominant level being detected. The driving circuit or the control circuit is further configured to shorten a delay time from when the edge is detected to when the switching element is turned on.

BRIEF DESCRIPTION OF DRAWINGS

The objects, features and advantages of the present disclosure will become more apparent from the following detailed description made with reference to the accompanying drawings. In the drawings.

DETAILED DESCRIPTION

Hereinafter, multiple embodiments will be described with reference to the drawings. In each embodiment, the substantially same elements are denoted by the same reference signs and description thereof will be omitted.

First Embodiment

The following describes a first embodiment with reference to FIGS. 1 to 5.

<Configuration of Communication System>

Figure 1:
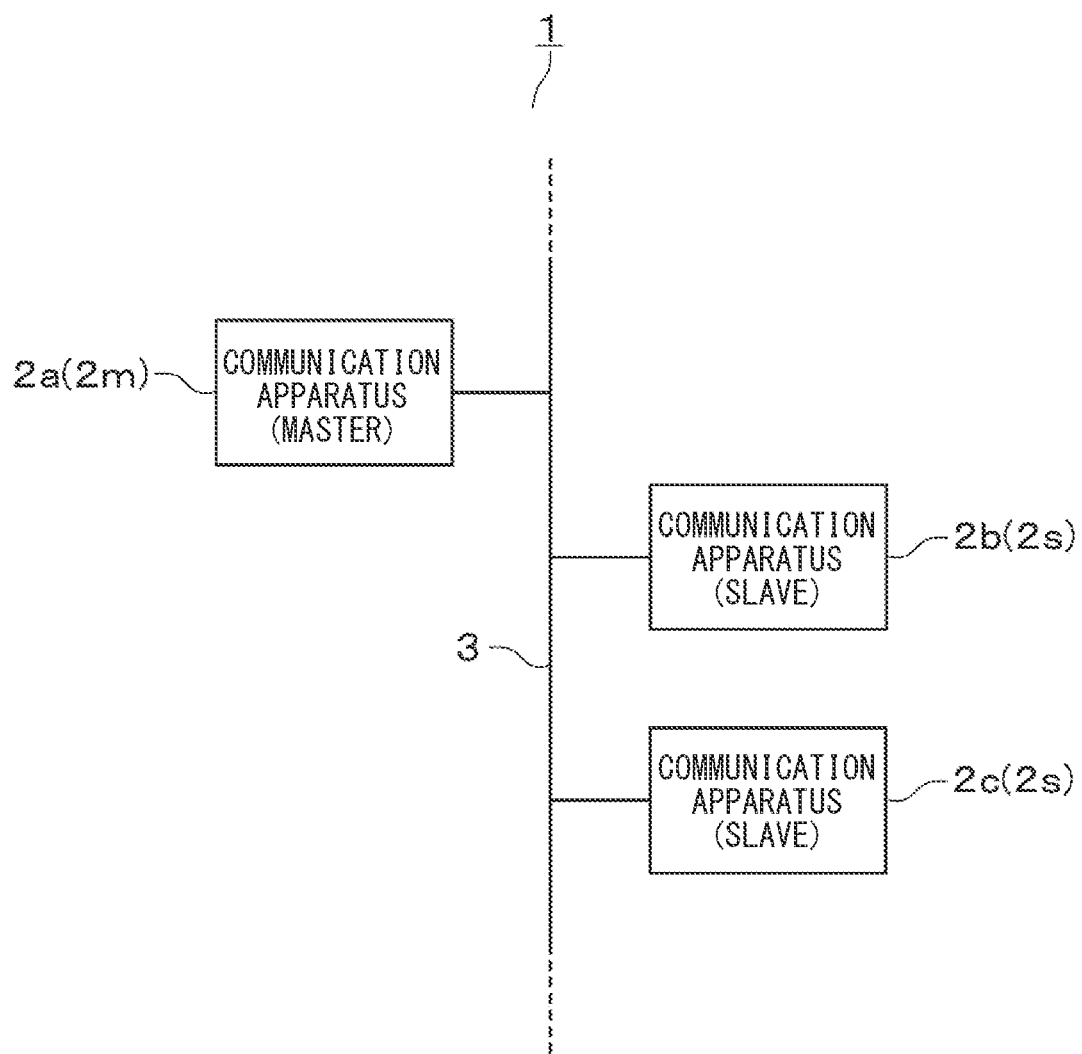
FIG. 1 is a diagram schematically showing a configuration of a communication system according to a first embodiment.

A communication system 1 shown in FIG. 1 is used, for example, for control communication between a plurality of electronic control apparatuses mounted on a vehicle. The communication system 1 has a configuration in which a plurality of communication apparatuses 2a, 2b, 2c are connected via a bus 3 corresponding to a transmission path. In the following, the communication apparatuses 2a, 2b, 2c will be collectively referred to as a communication apparatus 2 when it is not necessary to distinguish them from each other. In this case, the communication system 1 includes three communication apparatuses 2, but may include two communication apparatuses 2 or four or more communication apparatuses 2.

The plurality of communication apparatuses 2 are configured as semiconductor integrated circuits, that is, ICs, and transmit and receive data via the bus 3. In the communication system 1, in synchronization with the communication of one of the plurality of communication apparatuses 2, specifically, the communication apparatus 2a, the other communication apparatuses 2b and 2c transmit. Hereinafter, the communication apparatus 2a is also referred to as a master 2m, and the communication apparatuses 2b and 2c are each referred to as a slave 2s.

In the communication system 1, data transmission/reception is executed by CXPI communication. In CXPI communication, the master 2m supplies a clock to the slaves 2s via the bus 3, and the slaves 2s each execute communication synchronized with the clock supplied via the bus 3. In this case, the bus 3 is configured so that the signal level on the bus 3 becomes the low level when the high level signal and the low level signal are concurrently output from different communication apparatuses 2. This function is used to implement bus arbitration. That is, in this case, the low level signal corresponds to a dominant level which is a signal level dominant on the bus 3; the high level signal corresponds to a recessive level which is a signal level recessive on the bus 3.

On the bus 3, pulse width modulation signals (i.e., PWM signal) are used as transmission path codes. The signal level changes from a high level to a low level at the boundary of bits, and the signal level changes from the low level to the high level in the middle of the bit. The binary signals are represented by two types of PWM signals having different duty ratios. In the following, one with a relatively short low-level period is referred to as a recessive code, and the other one with a relatively long low-level period is referred to as a dominant code. The recessive code corresponds to "logical value=1", and the dominant code corresponds to "logical value=0".

In this case, the recessive code is set so that the first 1/3 period of 1 bit becomes the low level and the subsequent 2/3 period becomes the high level. Further, in this case, the dominant code is set so that the first 2/3 period of 1 bit becomes the low level and the subsequent 1/3 period becomes the high level. For this reason, when the recessive code and the dominant code collide on the bus 3, the dominant code wins the arbitration.

<Configuration of Communication Apparatus>

Figure 2:
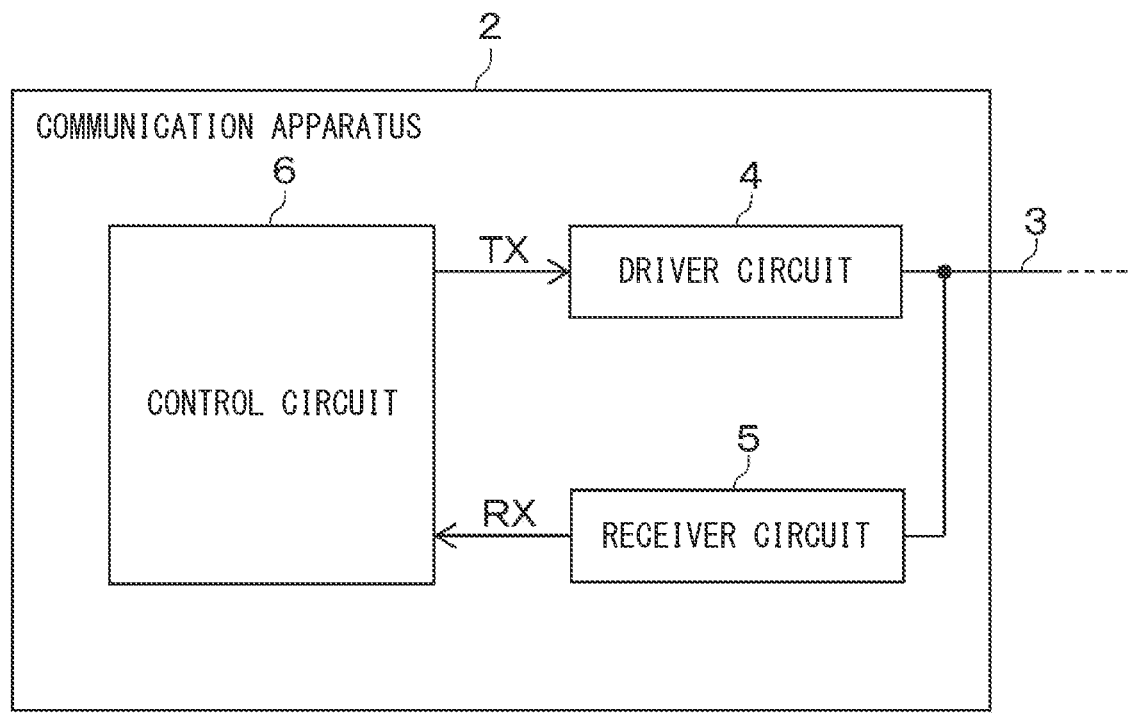
FIG. 2 is a diagram schematically showing a configuration of a communication apparatus according to the first embodiment.

The master 2m and the slaves 2s have substantially the same configuration, although some configurations such as the presence/absence of a configuration for supplying a clock are different. That is, as shown in FIG. 2, the communication apparatus 2 includes a driver circuit 4, a receiver circuit 5, and a control circuit 6. A transmission signal TX output from the control circuit 6 is given to the driver circuit 4.

The driver circuit 4 transmits data corresponding to the transmission signal TX via the bus 3. The receiver circuit 5 receives the data transmitted via the bus 3 and outputs the reception signal RX to the control circuit 6. The control circuit 6, which is configured as a logic circuit, generates a transmission signal TX, and outputs the transmission signal TX to the driver circuit 4. Further, the control circuit 6 receives a reception signal RX output from the receiver circuit 5, and executes a predetermined process based on the received reception signal RX.

<Specific Configuration of Receiver Circuit>

Figure 3:
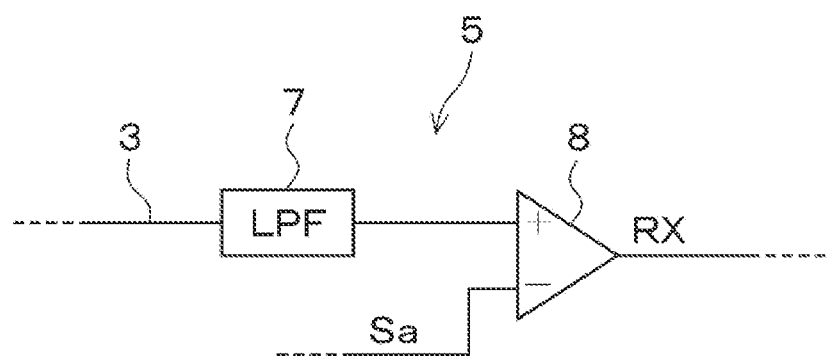
FIG. 3 is a diagram schematically showing a specific configuration of a receiver circuit according to the first embodiment.

As shown in FIG. 3, the receiver circuit 5 includes a filter circuit 7 and a comparator 8. In this case, the signal on the bus 3 is given to the non-inverting input terminal of the comparator 8 via the filter circuit 7. The filter circuit 7 is, for example, a low-pass filter, that is, an LPF or the like, and is inserted as a noise countermeasure. The output signal of the filter circuit 7 is a signal in which noise is removed from the signal on the bus 3 and a delay corresponding to the time constant of the filter circuit 7 occurs.

A threshold signal Sa is given to the inverting input terminal of the comparator 8. The threshold signal Sa is a signal corresponding to the threshold Th for detecting an edge in which the signal level on the bus 3 changes from a high level to a low level. Hereinafter, such an edge is also referred to as a boundary edge. With such a configuration, the comparator 8 is designed to output a high-level signal when the signal level on the bus 3 is higher than the threshold value Th, and output a low-level signal when the signal level on the bus 3 is lower than the threshold value Th. The output signal of the comparator 8 is given to the control circuit 6 as the above-mentioned reception signal RX.

The receiver circuit 5 having the above configuration can detect an edge at which the signal level on the bus 3 changes from a high level to a low level, that is, a boundary edge. Specifically, the receiver circuit 5 can detect the boundary edge when the reception signal RX, which is the output signal of the comparator 8, changes from the high level to the low level. As described above, in the present embodiment, the receiver circuit 5 has a function as an edge detection circuit.

<Specific Configuration of Driver Circuit>

Figure 4:
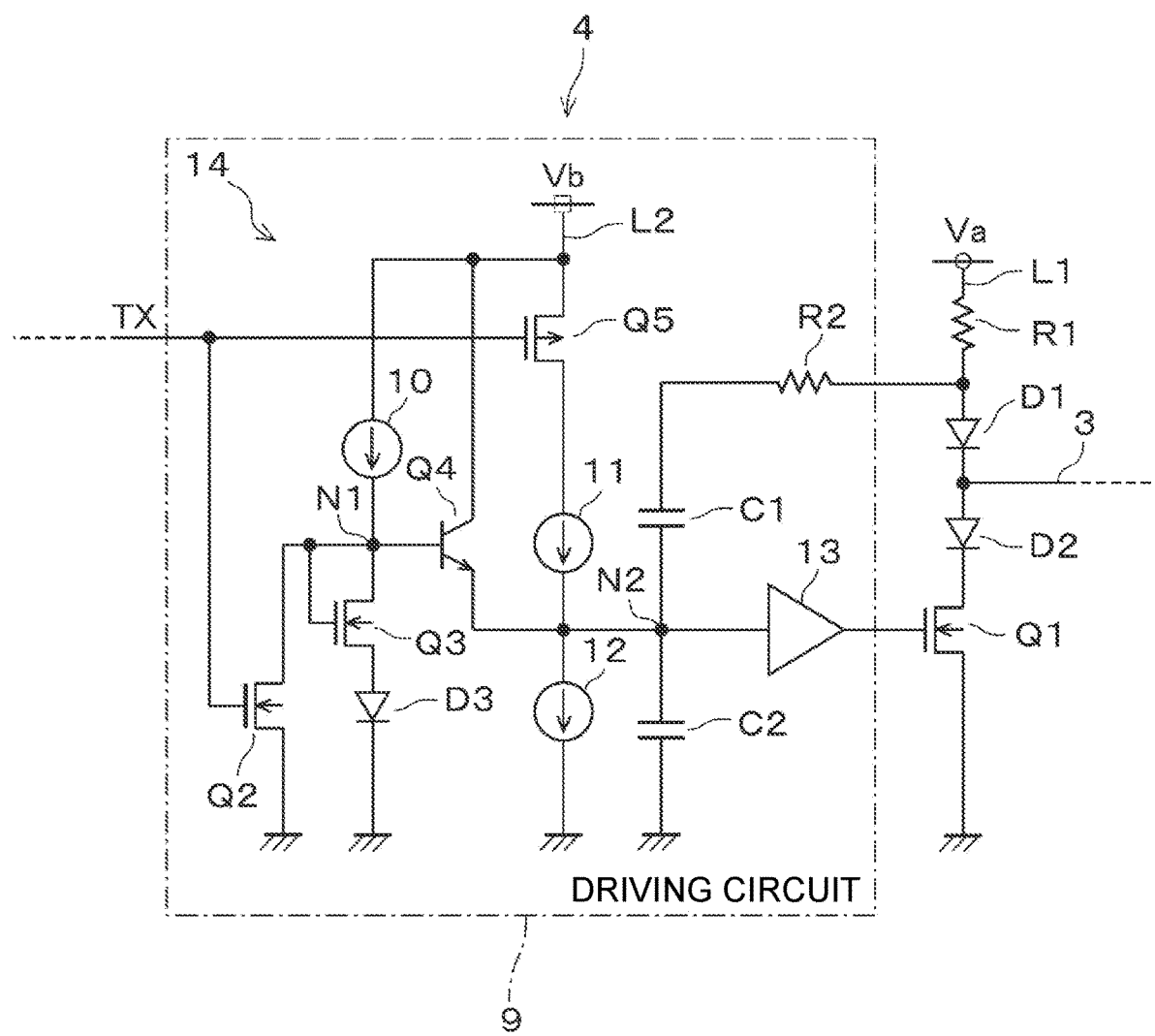
FIG. 4 is a diagram schematically showing a specific configuration of a driver circuit according to the first embodiment.

As shown in FIG. 4, the driver circuit 4 has a circuit configuration of open-drain output so as to enable the bus arbitration described above. The driving circuit 4 includes (i) an output stage including a transistor Q1, diodes D1, D2, and a resistor R1, and (ii) a driving circuit 9. In the driver circuit 4, the cathode of the diode D1 is connected to the bus 3. The anode of the diode D1 is connected to the power supply line L1 to which the power supply voltage Va is supplied via a pull-up resistor R1. The power supply voltage Va is a +B system power supply voltage generated from the power supply +B of a battery mounted on the vehicle.

The transistor Q1 is an N-channel type MOS transistor, and its drain is connected to the bus 3 via the diode D2 in the opposite direction. The source of the transistor Q1 is connected to the ground which is the reference potential (0V) of the circuit. The transistor Q1 functions as a switching element capable of setting the signal level on the bus 3 to a low level (0V) by turning on.

The driving circuit 9 drives the transistor Q1 based on the transmission signal TX given from the control circuit 6. In other words, the operation of the driving circuit 9 is controlled by the control circuit 6. The driving circuit 9 includes transistors Q2 to Q5, a diode D3, current sources 10 to 12, capacitors C1 and C2, a resistor R2, and a gate driver 13. The transistor Q2 is an N-channel type MOS transistor, and a transmission signal TX is given to the gate thereof. The source of transistor Q2 is connected to ground and its drain is connected to node N1.

The transistor Q3 is an N-channel type MOS transistor, and its source is connected to the ground via the diode D3 in the forward direction. The transistor Q3 is connected to a so-called diode, and its gate and drain are commonly connected and connected to the node N1. The current source 10 is connected between (i) the power supply line L2 to which the power supply voltage Vb is supplied and (ii) the node N1.

The power supply voltage Vb is a power supply voltage of a system, such as a 5V power supply system, different from the power supply voltage of the +B system. The power supply voltage Vb may be a +B system power supply voltage. The transistor Q4 is an NPN type bipolar transistor, and its base is connected to the node N1. The collector of the transistor Q4 is connected to the power supply line L2, and its emitter is connected to the node N2. The transistor Q5 is a P-channel type MOS transistor, and a transmission signal TX is given to the gate thereof.

The source of the transistor Q5 is connected to the power supply line L2, and its drain is connected to the node N2 via the current source 11. The current source 12 is connected between the node N2 and the ground. In the present embodiment, the current source 11 outputs, for example, twice as much current as the current source 12. That is, the current value I1 of the current source 11 and the current value I2 of the current source 12 have a relationship shown in the following Expression (1), for example.

$$I1=2\times I2 \quad (1)$$

One terminal of the capacitor C1 is connected to the anode of the diode D1 via the resistor R2. The other terminal of the capacitor C1 is connected to the node N2. The capacitor C2 is connected between the node N2 and the ground. In this case, the capacitors C1 and C2 have the same capacitance value. The gate driver 13 functions as a mere buffer, its input terminal is connected to the node N2, and its output terminal is connected to the gate of the transistor Q1. In this case, the gate of the transistor Q1 corresponds to a control terminal of the switching element, and the gate voltage corresponds to a control voltage.

The transmission signal TX output from the control circuit 6 is a binary signal, and is an off command for an off drive of the transistor Q1 at the high level and an on command for an on drive of the transistor Q1 at the low level. In this case, the high level of the transmission signal TX is a voltage value at which the transistor Q2 can be turned on and the transistor Q5 can be turned off, and is a voltage value equivalent to, for example, the power supply voltage Vb. Further, the low level of the transmission signal TX is a voltage value at which the transistor Q2 can be turned off and the transistor Q5 can be turned on, for example, 0V.

<Delay Shortening Sub-Circuit>

In CXPI communication, the master 2m always outputs a recessive code, which is the clock described above. The slave 2s operates in synchronization with this clock. Specifically, the slave 2s operates in synchronization with the timing at which the boundary edge is detected by the receiver circuit 5 as described above, that is, the timing at which the falling edge of the clock is detected. In the slave 2s, the control circuit 6 gives a low-level transmission signal TX to the driving circuit 9 when the boundary edge is detected. Then, the driving circuit 9 performs an on drive to turn the transistor Q1 on when a low-level transmission signal TX is given.

However, in the above configuration, there is existing a delay time from when the signal level on the bus 3 changes from the high level to the low level (i.e., from when the boundary edge which is the falling timing of the clock is detected) to when the gate voltage of the transistor Q1 reaches the threshold voltage Vt (Q1) and the transistor Q1 is turned on. This delay time is a period determined by the delay in the filter circuit 7, the delay in the comparator 8, the logic delay in the control circuit 6, the delay associated with the circuit operation of the driver circuit 4, and the like. Such a delay time needs to satisfy the time specified by the communication protocol of CXPI (for example, 0.11 Tbit). Note that 1 Tbit is the baud rate cycle on the bus.

In the above configuration, a noise removing filter circuit 7 is inserted in front of the receiver circuit 5, and the delay time is longer than in a configuration in which such a filter circuit is not provided. Therefore, the communication apparatus 2 of the present embodiment is provided with a delay shortening sub-circuit 14, which may also referred to as a delay shortening unit 14, for shortening such a delay time. In this case, the delay shortening sub-circuit 14 is configured by the transistors Q2, Q3, Q4, the diode D3, and the current source 10 of the driving circuit 9. That is, in the present embodiment, the delay shortening sub-circuit 14 is provided in the driving circuit 9.

Further, in this case, the transistor Q3 has a threshold voltage Vt(Q3) lower than the threshold voltage Vt(Q1) at which the transistor Q1 turns on, by a predetermined value a. That is, the relationship between the threshold voltage Vt(Q3) and the threshold voltage Vt(Q1) is expressed by the following Expression (2).

$$Vt(Q3)=Vt(Q1)-\alpha \quad (2)$$

Although the details will be described later, the delay shortening sub-circuit 14 performs a voltage control to increase the gate voltage of the transistor Q1 up to the threshold voltage Vt(Q3) which is lower than a threshold voltage Vt(Q1) by a predetermined value a in a period including the start time of the on period in which the driving circuit 9 performs the on drive to turn th transistor Q1 on. By doing so, the delay time is shortened. In this case, the threshold voltage Vt(Q3) corresponds to a first voltage V1. Further, the driving circuit 9, which is provided with such a delay shortening sub-circuit 14, performs the constant current control after the gate voltage of the transistor Q1 rises to the threshold voltage Vt(Q3) due to the voltage control described above.

Figure 5:
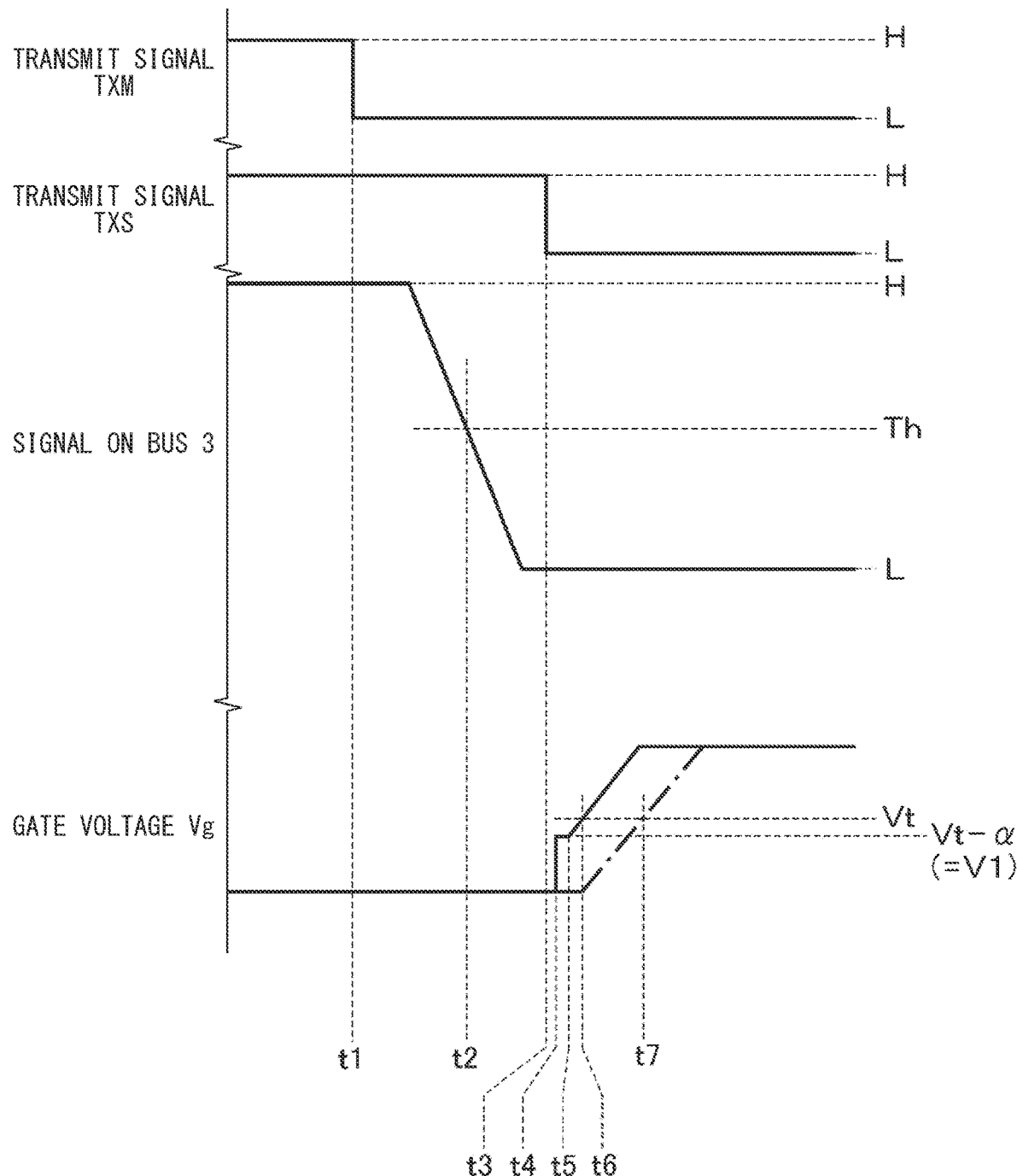
FIG. 5 is a timing chart schematically showing a transmission signal, a bus waveform, and a gate voltage in an operation of the communication apparatus according to the first embodiment.

Next, the operation of the above configuration will be described with reference to the timing chart of FIG. 5. In FIG. 5 and the like, the transmission signal TX in the master 2m is referred to as a transmission signal TXM; the transmission signal TX in the slave 2s is referred to as a transmission signal TXS. The gate voltage of the transistor Q1 is referred to as Vg; the threshold voltage Vt(Q1) of the transistor Q1 is referred to as Vt. Further, in the timing chart of FIG. 5 and the like, the low level is referred to as "L" and the high level is referred to as "H" for the binary signal.

In this case, the time point t1 when the transmission signal TXM changes from the high level to the low level is a falling edge of the clock, which corresponds to a boundary edge. In a period before time point t1, the transmission signal TXS is at a high level. In such a period, the driving circuit 9 performs n off drive to turn the transistor Q1 off. The operation of each part in an off period in which the driving circuit 9 performs the off drive to turn the transistor Q1 off is as follows.

That is, since the transmission signal TXS is at a high level, the transistor Q2 is turned on and the transistor Q5 is turned off. Since the transistor Q5 is turned off, the gate-source capacitance of the transistor Q1 is discharged by the current of the current source 12. As a result, the gate voltage Vg drops and the transistor Q1 turns off. Therefore, the signal level on the bus 3 is maintained at a high level in the period before the time point t1. Further, since the transistor Q2 is turned on, the transistors Q3 and Q4 are turned off.

Therefore, the delay shortening sub-circuit 14 has no effect on the voltage VN2 of the node N2 and thus the gate voltage Vg of the transistor Q1.

After the transmission signal TXM shifts to the low level at the time point t1, the boundary edge is detected by the receiver circuit 5 at the time point t2 when the signal level on the bus 3 drops and reaches the threshold value Th. The time from the time point t1 to the time point t2 includes (i) a delay related to the signal output on the master 2m side, (ii) a delay time due to the filter circuit 7 and the comparator 8, and the like. When the boundary edge is detected in this way, the control circuit 6 shifts the transmission signal TXS from the high level to the low level. The time from the time point t2 to the time point t3 when the transmission signal TXS turns to the low level includes a logic delay due to the control circuit 6.

In the period after the time point t3, the transmission signal TXS becomes a low level. In such a period, the driving circuit 9 performs the on drive to turn the transistor Q1 on. The operation of each part during the ON period in which the driving circuit 9 drives the transistor Q1 on is as follows. That is, since the transmission signal TXS is at a low level, the transistor Q2 is turned off and the transistor Q5 is turned on. Since the transistor Q2 is turned off, the transistors Q3 and Q4 are turned on. Since the transistor Q3 is turned on, a current flows from the power supply line L2 to the ground via the current source 10, the transistor Q3, and the diode D3.

As a result, the voltage VN1 of the node N1 becomes the voltage represented by the following Expression (3). Note that the forward voltage of the diode D3 is Vf.

$$VN1=Vt(Q3)+Vf \quad (3)$$

Further, since the transistor Q4 is turned on, the emitter voltage of the transistor Q4, that is, the voltage VN2 of the node N2 becomes the voltage represented by the following Expression (4). Note that it is assumed that the base-emitter voltage Vbe of the transistor Q4 is about the same as the forward voltage Vf of the diode D3.

$$VN2=Vt(Q3)=Vt(Q1)-\alpha \quad (4)$$

In the above configuration, the gate voltage Vg of the transistor Q1 is the same as the voltage VN2. Therefore, the gate voltage Vg of the transistor Q1 sharply rises from 0V to "Vt−α" at the time point t4 when a short time has passed from the time point t3. The time from the time point t3 to the time point t4 includes a delay time associated with the operation of each transistor.

In this case, since the transistor Q5 is turned on, a current having a current value I2 corresponding to the difference between the output current of the current source 11 and the output current of the current source 12 is supplied toward the gate of the transistor Q1. Therefore, after the above-mentioned voltage control is performed, the gate voltage Vg of the transistor Q1 rises to "Vt−α", a constant current control is performed in which a constant current is supplied to the gate of the transistor Q1.

By performing such a constant current control, the gate voltage Vg of the transistor Q1 rises relatively slowly with a constant slope from the time point t5 when a short time has passed since the time point t4. The slope of the rise in the gate voltage Vg at this time is determined by the current values I1 and I2 of the current sources 11 and 12 and the capacitance values of the capacitors C1 and C2. Then, at the time point t6 when the gate voltage Vg of the transistor Q1 reaches the threshold voltage Vt, the transistor Q1 is turned on.

The above-described embodiment provides the following effect. The communication apparatus 2 of the present embodiment includes a delay shortening sub-circuit 14 that shortens the delay time required from the time of an occurrence of the boundary edge to the time when the transistor Q1 is turned on. According to such a configuration, the delay time can be shortened. Even in the case where the filter circuit 7 is inserted in front of the receiver circuit 5 as in the configuration of the present embodiment, the communication protocol is sufficiently satisfied with.

In this case, the delay shortening sub-circuit 14 is provided in the driving circuit 9 of the driver circuit 4. In the period including the start time of the on period in which the driving circuit 9 performs the on drive to turn the transistor Q1 on, the voltage is controlled so that the gate voltage of the transistor Q1 rises to the first voltage V1 which is lower than the threshold voltage Vt by a predetermined value a. This configuration reduces the delay time. Hereinafter, the effect of shortening the delay time by the present embodiment will be described with reference to a comparative example corresponding to a known configuration in which the transistor Q1 is subject to the on drive by a constant current drive throughout the on period.

In the comparative example, as shown by the alternate long and short dash line in FIG. 5, the gate voltage rises relatively slowly with a constant slope from the vicinity of the time point t6 after the time point t4 when the gate voltage starts to rise in the present embodiment. As described above, in the comparative example, the gate voltage of the transistor Q1 rises relatively slowly with a constant slope throughout the on period. Therefore, it takes a relatively long time for the gate voltage to reach the threshold voltage Vt and for the transistor Q1 to turn on.

Therefore, in the comparative example, the delay time due to the operation of the driving circuit 9 is the time from the time point t1 to the time point t7. The delay time in the comparative example is thus longer than the delay time that is the time from the time point t1 to the time point t6 in the present embodiment. On the other hand, in the present embodiment, by performing the voltage control described above, the gate voltage of the transistor Q1 rises to the first voltage V1 at once in a period including the start time of the on period.

Then, in the present embodiment, constant current control is performed after the gate voltage rises to the first voltage V1 by performing such voltage control. As a result, the gate voltage reaches the threshold voltage Vt and the transistor Q1 turns on. According to this embodiment, as compared with the comparative example, the turn-on time of the transistor Q1, that is, the delay time due to the operation of the driving circuit 9 is shortened by at least the amount of time up to the time when the gate voltage of the transistor Q1 is raised to the first voltage V1 at a time.

Further, as described above, the driving circuit 9 of the present embodiment performs the constant current control for supplying a constant current to the gate of the transistor Q1 after the gate voltage of the transistor Q1 rises to the first voltage V1 by performing the voltage control. According to such a configuration, the gate voltage of the transistor Q1 rises to the first voltage V1 at once and then rises relatively gently with a constant slope to reach the threshold voltage Vt. When the gate voltage rises sharply and reaches the threshold voltage Vt and the transistor Q1 is turned on, there is a concern that the emission may be deteriorated due to the on operation. However, according to the above configuration, the gate voltage rises relatively slowly and reaches the threshold voltage Vt, and the transistor Q1 is turned on.

Therefore, according to the present embodiment, it is possible to reduce the risk of such emission deterioration while shortening the delay time due to the operation of the driving circuit 9.

Second Embodiment

Figure 6:
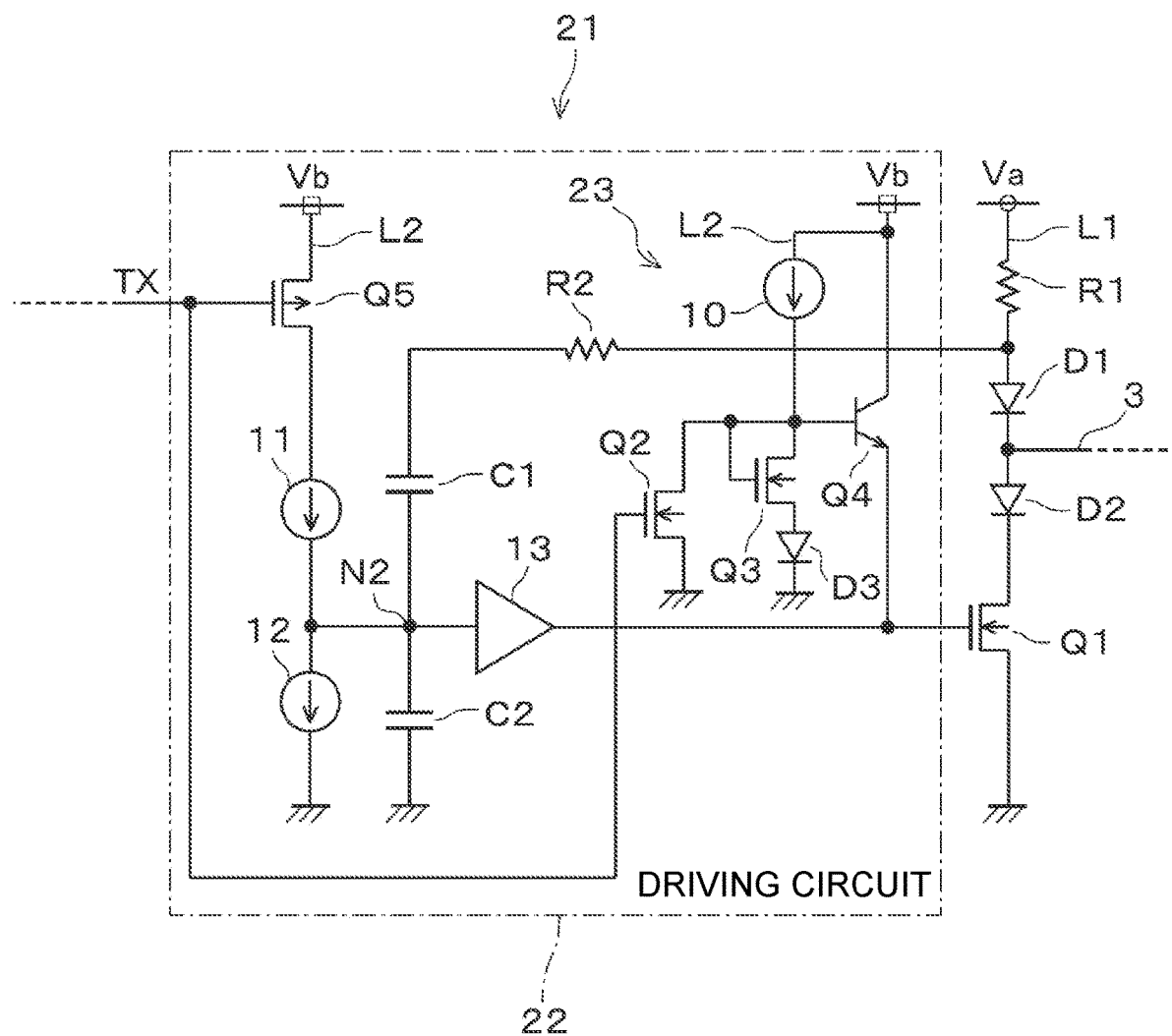
FIG. 6 is a diagram schematically showing a specific configuration of a driver circuit according to a second embodiment.

The following will describe a second embodiment in which the specific configuration of the driver circuit is changed with respect to the first embodiment, with reference to FIG. 6.

The delay shortening sub-circuit 14 of the first embodiment is configured to indirectly control the gate voltage of the transistor Q1 by controlling the voltage of the node N2, that is, the input terminal of the gate driver 13. However, the delay shortening sub-circuit may be configured to directly control the gate voltage of the transistor Q1.

Thus, the driver circuit 21 of this embodiment has a configuration as shown in FIG. 6. That is, the driver circuit 21 of the present embodiment is different from the driver circuit 4 of the first embodiment shown in FIG. 4 in that the driving circuit 22 is provided in place of the driving circuit 9. The driving circuit 22 has the same configuration as the driving circuit 9, but the connection destination of the emitter of the transistor Q4 is different.

That is, the emitter of the transistor Q4 is connected not to the node N2 but to the output terminal of the gate driver 13, that is, the gate of the transistor Q1. In this case, the delay shortening sub-circuit 23 is composed of the transistors Q2, Q3, Q4, the diode D3, and the current source 10 of the driving circuit 22. As described above, the delay shortening sub-circuit 23 of the present embodiment is configured to directly control the gate voltage of the transistor Q1.

In the configuration of the present embodiment described above, similarly to that of the first embodiment, it is possible to control the voltage so that the gate voltage of the transistor Q1 rises to the threshold voltage Vt(Q3) which is lower than the threshold voltage Vt(Q1) by a predetermined value a in the period including the start time of the on period in which the driving circuit 22 performs the on drive to turn the transistor Q1 on. Therefore, the delay time can be shortened by the present embodiment as well as the first embodiment.

Third Embodiment

Figure 7:
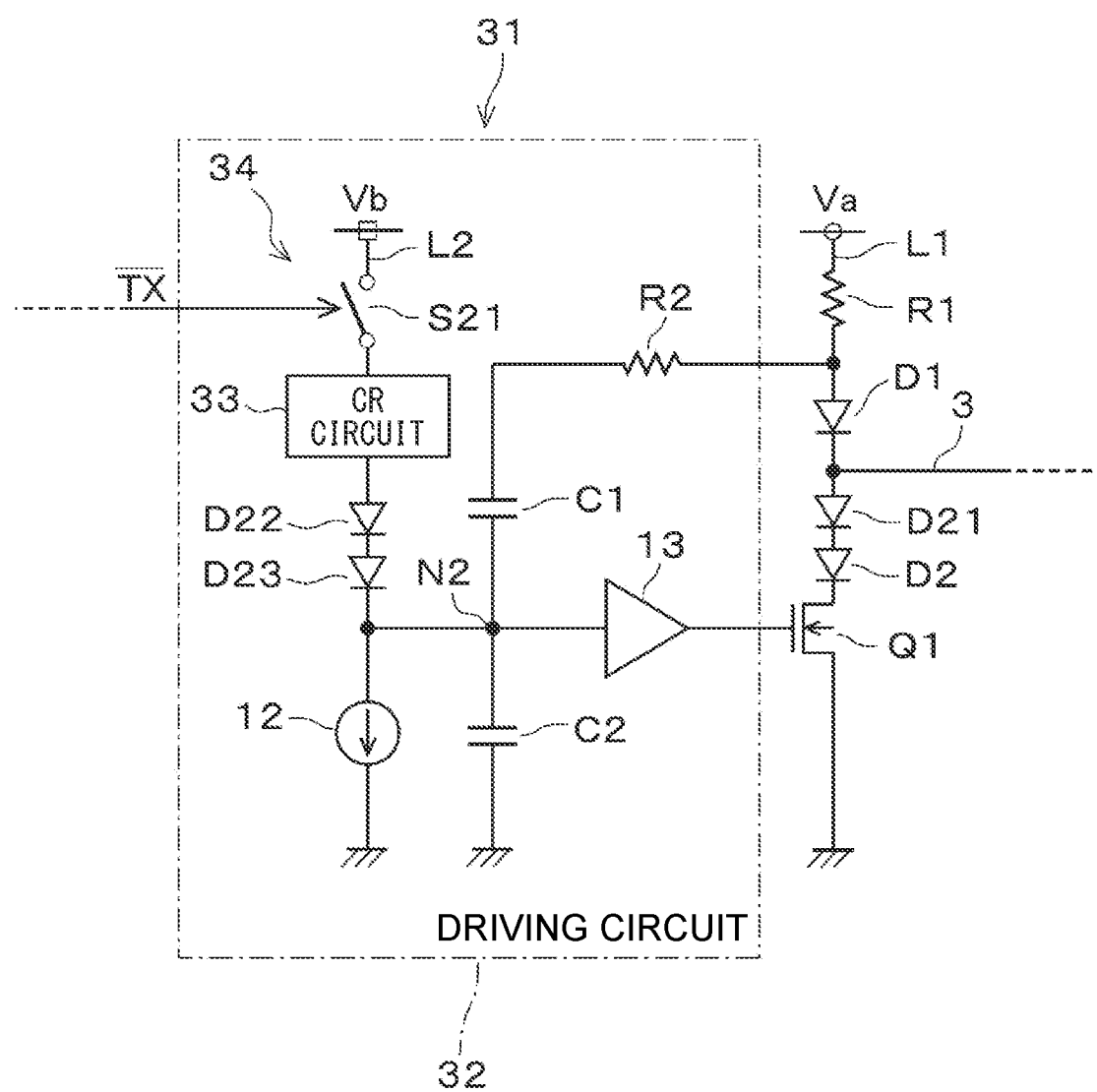
FIG. 7 is a diagram schematically showing a specific configuration of a driver circuit according to a third embodiment.
Figure 8:
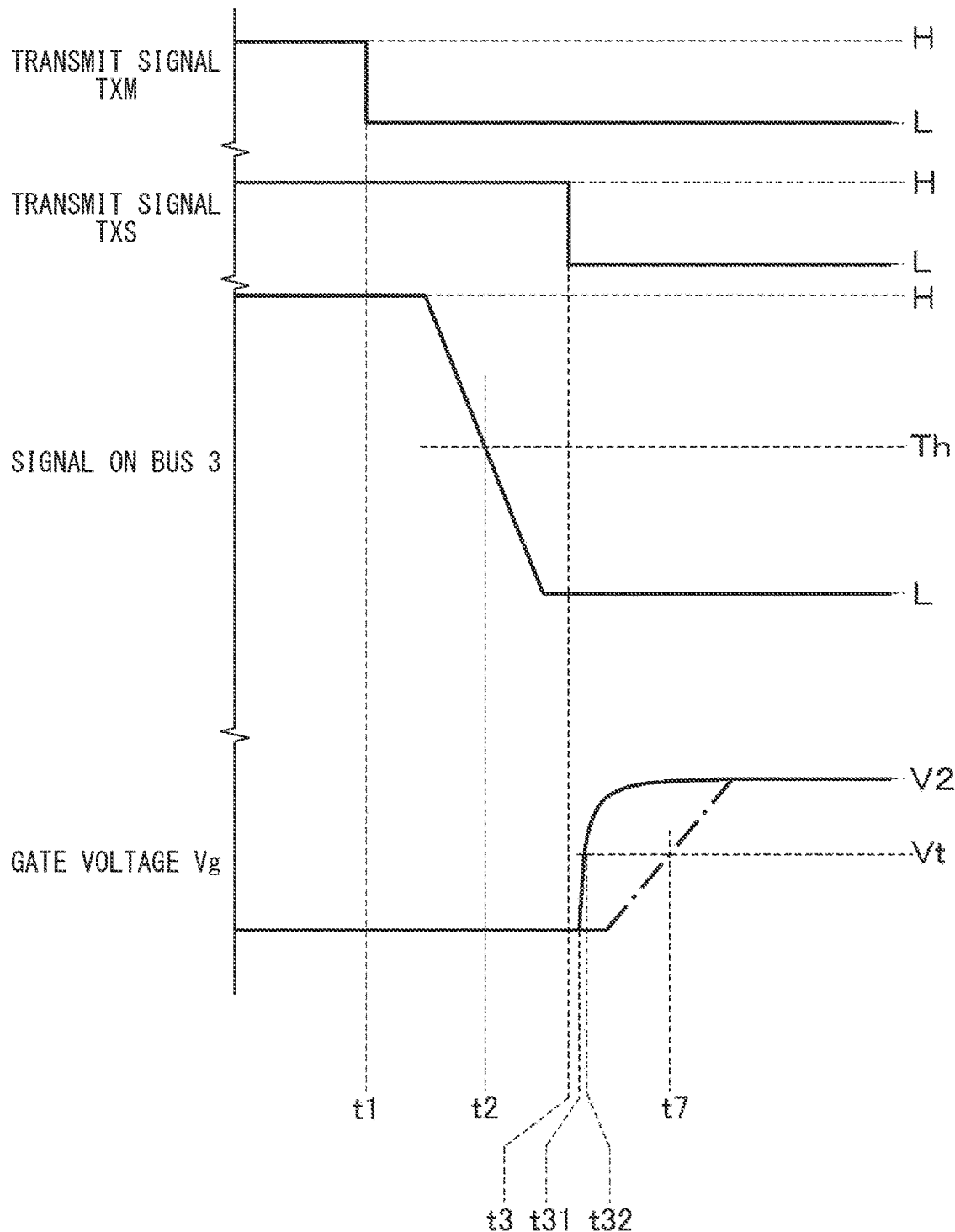
FIG. 8 is a timing chart schematically showing a transmission signal, a bus waveform, and a gate voltage in an operation of the communication apparatus according to the third embodiment.

Hereinafter, a third embodiment in which the specific configuration of the driver circuit has been changed with respect to the first embodiment will be described with reference to FIGS. 7 and 8. As shown in FIG. 7, the driver circuit 31 of the present embodiment is different from the driver circuit 4 of the first embodiment shown in FIG. 4 in that a diode D21 is added and the driving circuit 32 is provided in place of the driving circuit 9.

The anode of the diode D21 is connected to the bus 3 and its cathode is connected to the anode of the diode D2. That is, in this case, the drain of the transistor Q1 is connected to the bus 3 via the two diodes D2 and D21 in opposite directions. It is assumed that such a diode D21 is provided only in the slave 2s and not in the master 2m. That is, in the master 2m, it is assumed that the drain of the transistor Q1 is connected to the bus 3 via one diode D2 in the opposite direction as in the driver circuit 4 of the first embodiment.

The driving circuit 32 is different from the driving circuit 9 in that the switch S21, the filter circuit 33, and the diodes D22 and D23 are provided in place of the transistors Q2 to Q5, the current sources 10, 11 and the diode D3. The switch S21 opens and closes between the power supply line L2 and the node N2, and its on/off control is controlled by the transmission signal TX bar, which is an inverted signal of the transmission signal TX.

In FIG. 7, the transmission signal TX bar is indicated by adding "-" above the TX. The switch S21 is turned on when the transmission signal TX bar is at a high level and is turned off when the transmission signal TX bar is at a low level. In this case, one terminal of the switch S21 is connected to the power supply line L2, and the other terminal is connected to the input terminal of the filter circuit 33. The filter circuit 33 is, for example, a CR filter composed of a resistor and a capacitor.

The output terminal of the filter circuit 33 is connected to the node N2 via the diodes D22 and D23 in the forward direction. The switch S21 can be configured by using a semiconductor switching element such as a MOS transistor.

In the present embodiment, the delay shortening sub-circuit 34 is configured by the switch S21, the filter circuit 33, and the diodes D22 and D23. That is, the delay shortening sub-circuit 34 is provided in the driving circuit 32. In this case, the power supply voltage Vb is a voltage sufficiently higher than the threshold voltage Vt of the transistor Q1. The driving circuit 32 provided with the delay shortening sub-circuit 34 performs voltage control so that the gate voltage of the transistor Q1 rises to a second voltage V2 higher than the threshold voltage Vt. The second voltage V2 corresponds to a voltage obtained by subtracting the voltage (=2·Vf) obtained by adding the forward voltages of the diodes D22 and D23 from the power supply voltage Vb.

In other words, the driving circuit 32 provided with the delay shortening sub-circuit 34 is subjected to voltage control in the same manner as the delay shortening sub-circuit 14. As a result, even after the gate voltage of the transistor Q1 rises to "Vt−α" corresponding to the first voltage V1, the voltage control is continued so that the gate voltage rises to the second voltage V2 higher than the threshold voltage Vt. In this case, the delay shortening sub-circuit 34 includes the filter circuit 33 interposed in series with the supply path of the second voltage V2 to the gate of the transistor Q1.

Next, the operation of the above configuration will be described with reference to the timing chart of FIG. 8. In this case, the operation of each part in the off period in which the driving circuit 32 performs the off drive to turn the transistor Q1 off is as follows. That is, since the transmission signal TXS is at a high level, the switch S21 is turned off. As a result, the gate-source capacitance of the transistor Q1 is discharged by the current of the current source 12, so that the gate voltage Vg drops and the transistor Q1 is turned off.

Further, in this case, the operation of each part during the ON period in which the driving circuit 32 performs the on drive to turn the transistor Q1 on is as follows. That is, since the transmission signal TXS is at a low level, the switch S21 is turned on. Since the switch S21 is on, the second voltage V2 is supplied to the node N2 and eventually to the gate of the transistor Q1.

As a result, the voltage VN2 of the node N2, and thus the gate voltage Vg of the transistor Q1 rises from 0V toward the second voltage V2 with a relatively steep slope from the time point t31 when a short time has passed from the time point t3 when the transmission signal TXS turned to the low level. Note that in this case, the filter circuit 33 is interposed in series in the supply path of the second voltage V2 with respect to the gate of the transistor Q1. Therefore, the waveform of the gate voltage Vg of the transistor Q1 becomes a slightly dull waveform due to the action of the filter circuit 33. Then, at the time point t32 when the gate voltage Vg of the transistor Q1 reaches the threshold voltage Vt, the transistor Q1 is turned on.

Since the present embodiment described above also includes the delay shortening sub-circuit 34 that shortens the delay time required from the boundary edge to the time when the transistor Q1 is turned on, the same effect as that of the first embodiment can be obtained. Further, in this case, the delay shortening sub-circuit 34 performs voltage control so that the gate voltage of the transistor Q1 rises to the second voltage V2 higher than the threshold voltage Vt throughout the on period of performing the on drive to turn the transistor Q1 on. Therefore, according to the present embodiment, the delay time due to the operation of the driving circuit 32 can be shortened as compared with the first embodiment as well as the comparative example.

In the configuration in which the voltage is controlled throughout the on period as described above, the slope of the increase in the gate voltage when reaching the threshold voltage Vt becomes steeper than in the configuration of the first embodiment, so that there is a concern that the emission may deteriorate. However, in this case, the waveform of the gate voltage of the transistor Q1 is slightly dull due to the action of the filter circuit 33 interposed in series with the supply path of the second voltage V2 to the gate of the transistor Q1. Therefore, in the present embodiment, the slope of the increase in the gate voltage when the threshold voltage Vt is reached becomes slightly gentle, and the risk of deterioration of emissions is reduced.

In the driver circuit 31 of the present embodiment, the gate voltage of the transistor Q1 in the output stage rises relatively steeply, and the transistor Q1 turns on relatively steeply. Therefore, there is a possibility that a current is drawn from the master 2m to the slave 2s through the bus 3. Specifically, there is a possibility that a current is drawn from the power supply line L1 to which the power supply voltage Va of the master 2m is supplied to the slave 2s via the resistor R1, the diode D1 and the bus 3. Such a current leads to deterioration of emissions.

However, in the driver circuit 31 of the present embodiment, that is, the driver circuit 31 of the slave 2s of the present embodiment, the drain of the transistor Q1 in the output stage is connected to the bus 3 via the two diodes D2 and D21 in the opposite direction. On the other hand, in the driver circuit of the master 2m, the drain of the transistor Q1 in the output stage is connected to the bus 3 via one diode D2 in the opposite direction. Therefore, the output terminal of the slave 2s has a higher voltage than the output terminal of the master 2m by the forward voltage Vf of the diode D21.

Therefore, even if the transistor Q1 of the driver circuit 31 of the slave 2s is suddenly turned on, the current from the power supply line L1 of the master 2m does not flow to the slave 2s side, but flows to the ground via the transistor Q1 of the output stage of the master 2m. As described above, according to the present embodiment, the possibility that the current is drawn from the master 2m to the slave 2s is suppressed to a low level, so that the risk of deterioration of emissions due to the current is reduced.

In the configuration of the first embodiment, the gate voltage of the transistor Q1 rises relatively slowly and the transistor Q1 turns on relatively slowly as compared with the configuration of the present embodiment. Therefore, it is unlikely that a current will be drawn from the master 2m to the slave 2s. However, as for the configuration of the first embodiment, as in the configuration of the present embodiment, if the drain of the transistor Q1 is connected to the bus 3 via the two diodes D2 and D21 in the opposite directions, the possibility that current is drawn from the master 2m to the slave 2s can be further reduced, and the risk of deterioration of emissions due to this can be further reduced.

Fourth Embodiment

Figure 9:
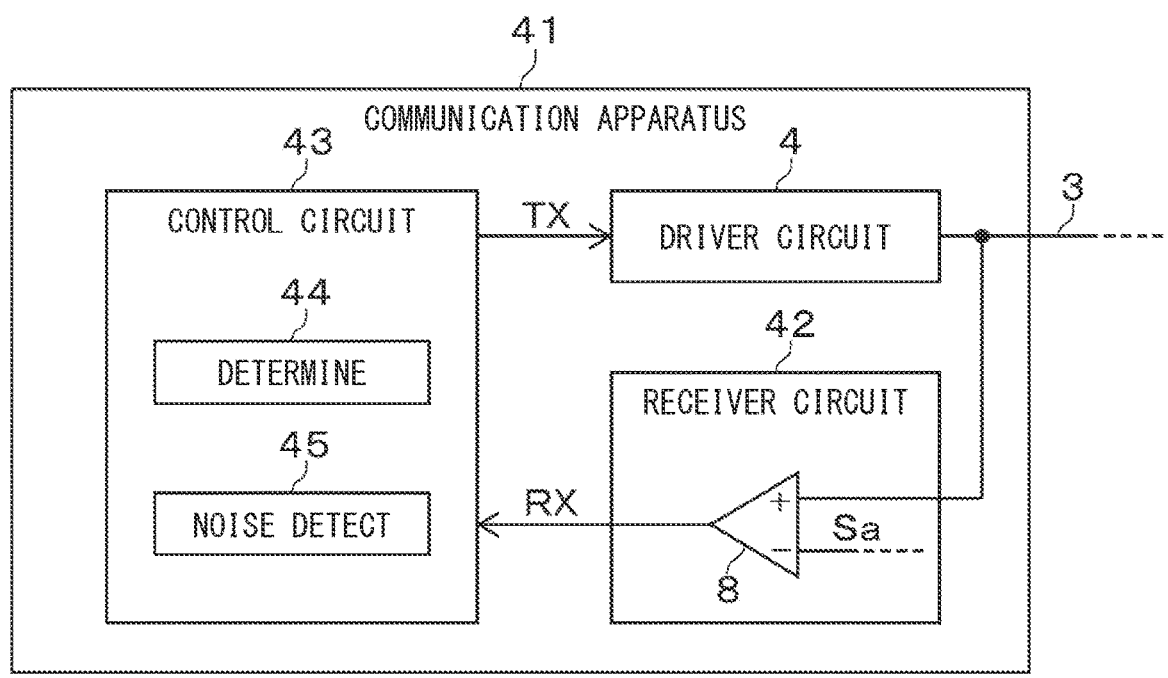
FIG. 9 is a diagram schematically showing a configuration of a communication apparatus according to a fourth embodiment.

Hereinafter, a fourth embodiment will be described with reference to FIGS. 9 and 10. As shown in FIG. 9, the communication apparatus 41 of the present embodiment is different from the communication apparatus 2 of the first embodiment in that the receiver circuit 42 is provided in place of the receiver circuit 5, and the control circuit 43 is provided in place of the control circuit 6. The receiver circuit 42 differs from the receiver circuit 5 shown in FIG. 3 in that the filter circuit 7 is omitted. In this case, the signal on the bus 3 is directly given to the non-inverting input terminal of the comparator 8.

The control circuit 43 has functions as a determination sub-circuit 44, which may also be referred to as a determination unit 44, and a noise detection sub-circuit 45, which may also be referred to as a noise detection unit 45. The determination sub-circuit 44 determines the code transmitted via the bus 3 by sampling the signal on the bus 3 at a predetermined sampling timing. The noise detection sub-circuit 45 detects the signal level on the bus 3 and detects the noise superimposed on the bus 3 based on the detection result. Specifically, each of these functions is realized as follows.

That is, the control circuit 43 includes a digital filter circuit including an addition/subtraction counter that adds or subtracts based on the level of the reception signal RX which is the output signal of the comparator 8. In this case, the signal RX1 is obtained by passing the reception signal RX through the double matching filter included in the digital filter circuit; the addition/subtraction counter adds when the signal RX1 is at a high level, and subtracts when the signal RX1 is at a low level.

Figure 10:
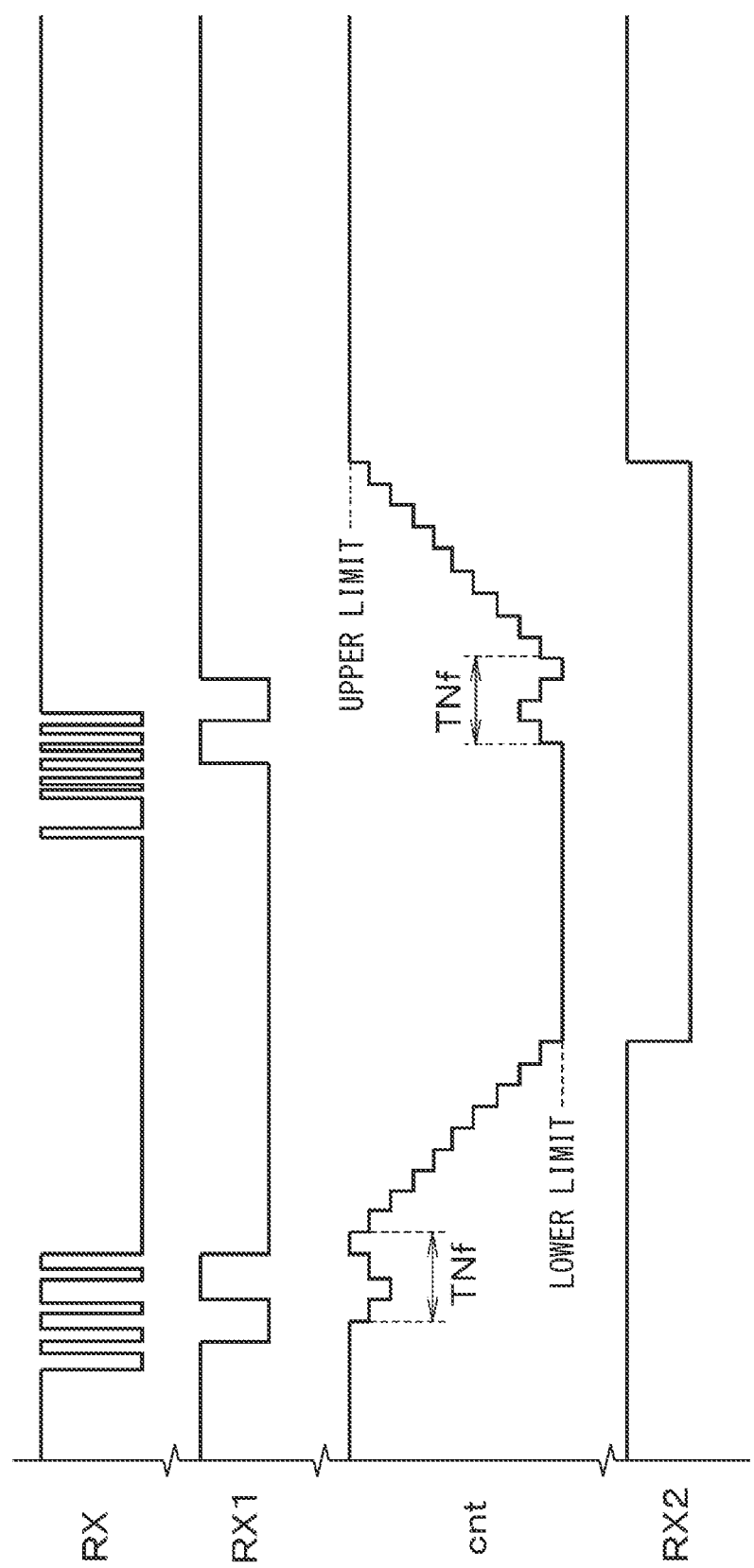
FIG. 10 is a timing chart schematically showing signals and a count value of an addition/subtraction counter in a control circuit according to the fourth embodiment.

Therefore, as shown in FIG. 10, the count value cnt of the addition/subtraction counter is incremented when the signal RX1 is at the high level and is decremented when the signal RX1 is at the low level. In the control circuit 43, the signal RX2 corresponding to the reception signal RX is generated based on the count value cnt of such an addition/subtraction counter. In this case, as shown in FIG. 10, the signal RX2 is a signal that shifts to a low level when the count value cnt reaches the lower limit value and turns to a high level when the count value cnt reaches the upper limit value.

The determination sub-circuit 44 determines the code transmitted via the bus 3 by sampling the signal RX2 thus generated at a predetermined sampling timing. In this case, assuming that the period during which the signal RX2 is at the low level is a Lo width, the sampling timing at the present time is determined according to the time obtained by adding a predetermined specified time corresponding to 6% of the bit rate to the Lo width at the previous time. Specifically, the sampling timing at the present time is the time when the time obtained by adding the specified time to the Lo width at the previous time has elapsed from the time of the fall of the signal RX2 at the present time.

In the above-mentioned addition/subtraction counter, when noise is not superimposed on the bus 3, once the subtraction is started, the subtraction is continuously performed for a predetermined period thereafter, and once the addition is started, the addition is continuously performed for a predetermined period thereafter. However, when chattering occurs in the output of the comparator 8 due to noise superimposed on the bus 3 and the level of the reception signal RX fluctuates, the addition/subtraction counter repeats addition and subtraction.

Then, as shown in FIG. 10, there will be a period in which the count value cnt of the addition/subtraction counter increases/decreases. In consideration of such a point, the noise detection sub-circuit 45 determines that noise is superimposed on the bus 3 when addition and subtraction by the addition/subtraction counter are repeatedly performed. Further, the noise detection sub-circuit 45 determines that the period TNf and TNr in which the count value cnt of the addition/subtraction counter increases/decreases is the noise detection period, which is the period in which noise is detected.

The Lo width described above accurately represents the low period in which the signal on the bus 3 is at the low level in the normal state where noise is not superimposed on the bus 3. If noise is however superimposed on the bus 3, it may be different from the actual low period. Specifically, when the reception signal RX corresponding to the vicinity of the falling edge of the signal on the bus 3 fluctuates due to the influence of noise, a delay occurs in the time when the count value cnt reaches the lower limit value. As a result, the Lo width of the signal RX2 becomes shorter than the actual low period. Further, suppose a case where the reception signal RX corresponding to the vicinity of the rising edge of the signal on the bus 3 fluctuates due to the influence of noise. In such a case, a delay occurs in the time when the count value cnt reaches the upper limit value, and as a result, the Lo width of the signal RX2 becomes longer than the actual low period.

For example, if the Lo width at the previous time is affected by noise and becomes shorter than the actual low period, and the Lo width at the present time accurately represents the actual low period, the following problem may occur. In the following, such a case will be referred to as a first case. In the first case, the sampling timing at the present time is determined based on the Lo width at the previous that is shorter than the actual low period, but the Lo width at the present time accurately represents the actual low period. Therefore, in the first case, the sampling timing at the present time is earlier than the timing that should be. As a result, even though the signal on the bus 3 is at a high level, it may be erroneously determined to be at a low level.

Further, for example, when the Lo width at the previous time accurately represents the actual low period and the Lo width at the present time is affected by noise and becomes longer than the actual low period, the following problem may occur. In the following, such a case will be referred to as a second case. In the second case, the sampling timing at the present time is determined based on the Lo width at the previous time which accurately represents the actual low period, but the Lo width at the present time is longer than the actual low period. Therefore, even though the signal on the bus 3 is at a high level, it may be erroneously determined to be at a low level.

Therefore, when the noise is detected by the noise detection sub-circuit 45, the determination sub-circuit 44 is provided to delay the sampling timing by a predetermined time according to the period in which the noise is detected. In this case, the "predetermined time" is a period in which the above-mentioned period TNf and the period TNr are added. Such a configuration can prevent, in both the first case and the second case, the signal RX2 from being sampled at a timing that should not be sampled, and prevent the occurrence of erroneous determination of the code transmitted via the bus 3.

According to the configuration in which the filter circuit 7 is not provided in the receiver circuit 42 as in the present embodiment, there is a merit that shortens the delay time required from the boundary edge to the time when the transistor Q1 is turned on as compared with the configuration of the first embodiment. On the other hand, in the configuration in which the filter circuit 7 for noise removal is not provided, there is a demerit that increases the possibility of erroneous determination due to the influence of noise. However, according to the present embodiment, as described above, the occurrence of erroneous determination due to the influence of noise is prevented. Therefore, there is no demerit due to the fact that the filter circuit 7 is not provided, and only the merit can be enjoyed.

Fifth Embodiment

Figure 11:
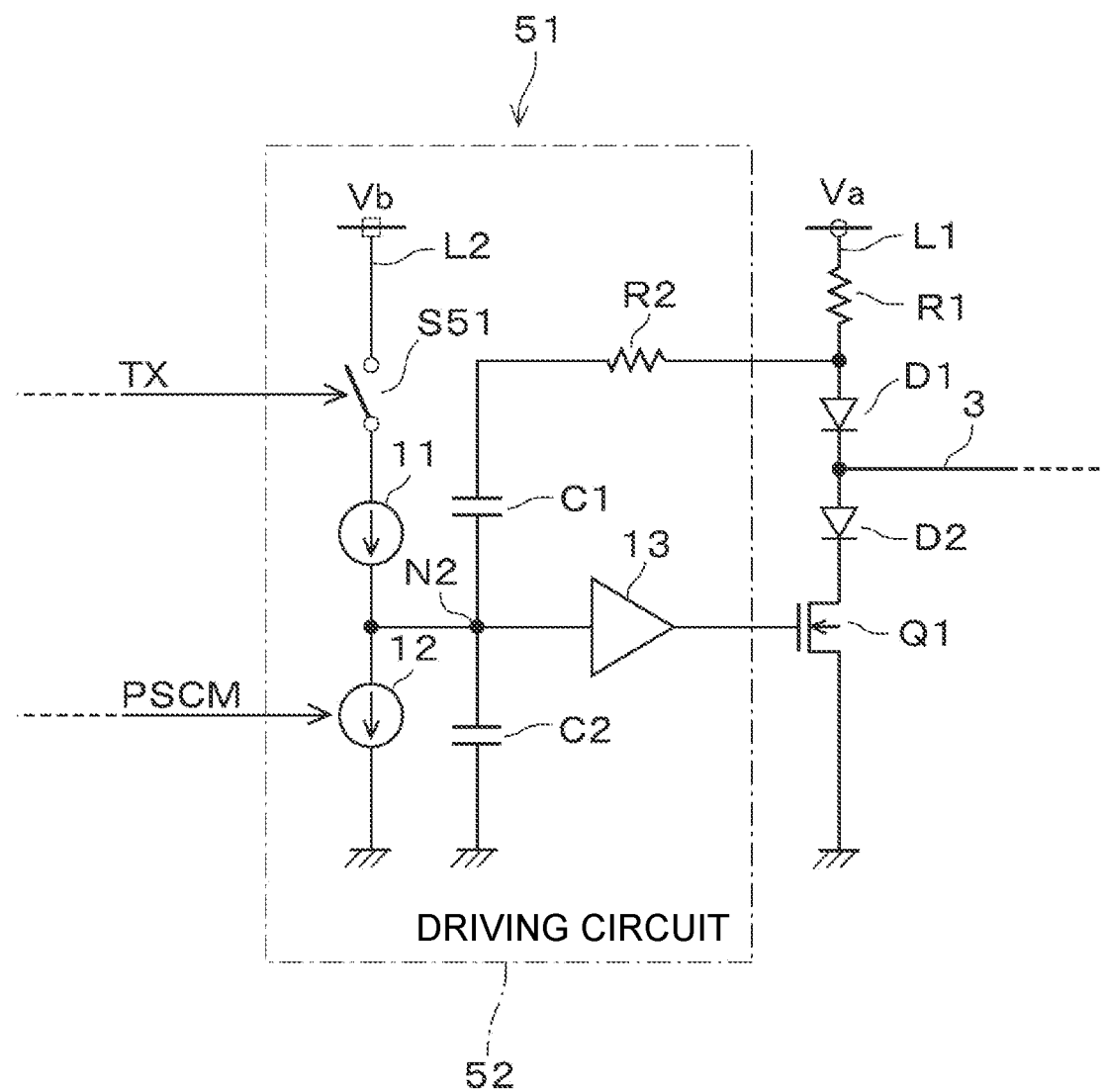
FIG. 11 is a diagram schematically showing a specific configuration of a driver circuit according to a fifth embodiment.

Hereinafter, a fifth embodiment in which the specific configurations of the driver circuit and the control circuit have been changed with respect to the first embodiment will be described with reference to FIGS. 11 to 13. As shown in FIG. 11, the driver circuit 51 of the present embodiment is different from the driver circuit 4 of the first embodiment shown in FIG. 4 in that the driving circuit 52 is provided in place of the driving circuit 9.

The driving circuit 52 is different from the driving circuit 9 in that the delay shortening sub-circuit 14 is omitted and that the switch S51 is provided in place of the transistor Q5. One terminal of the switch S51 is connected to the power supply line L2, and the other terminal is connected to the node N2 via the current source 11. The on/off of the switch S51 is controlled by the transmission signal TX. The switch S51 is turned off when the transmission signal TX is at a high level and is turned on when the transmission signal TX is at a low level.

The switch S51 can be configured by using a semiconductor switching element such as a MOS transistor. In this case, the current source 12 is configured to be able to stop its operation. Specifically, the current source 12 stops the operation during the period in which the cut signal PSCM, which will be described later, is at a high level, and executes the operation during the period in which the cut signal PSCM is at a low level.

Figure 12:
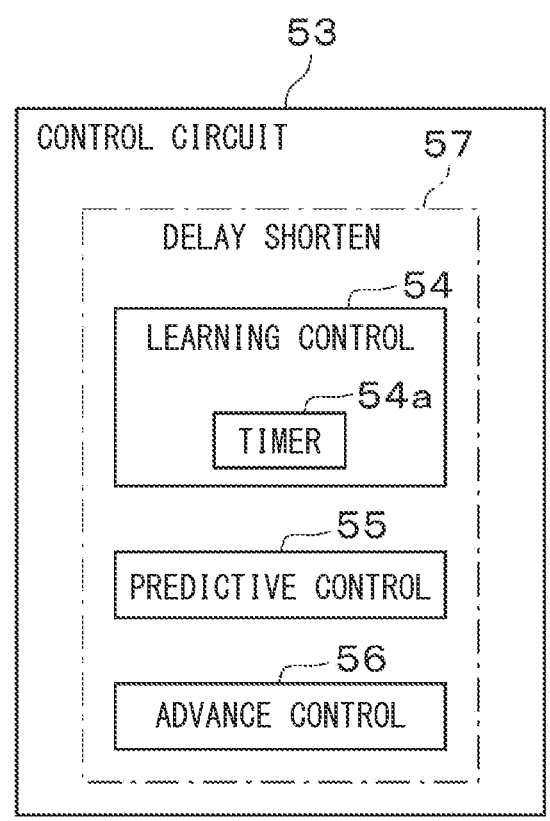
FIG. 12 is a diagram schematically showing a specific configuration of a control circuit according to the fifth embodiment.
Figure 13:
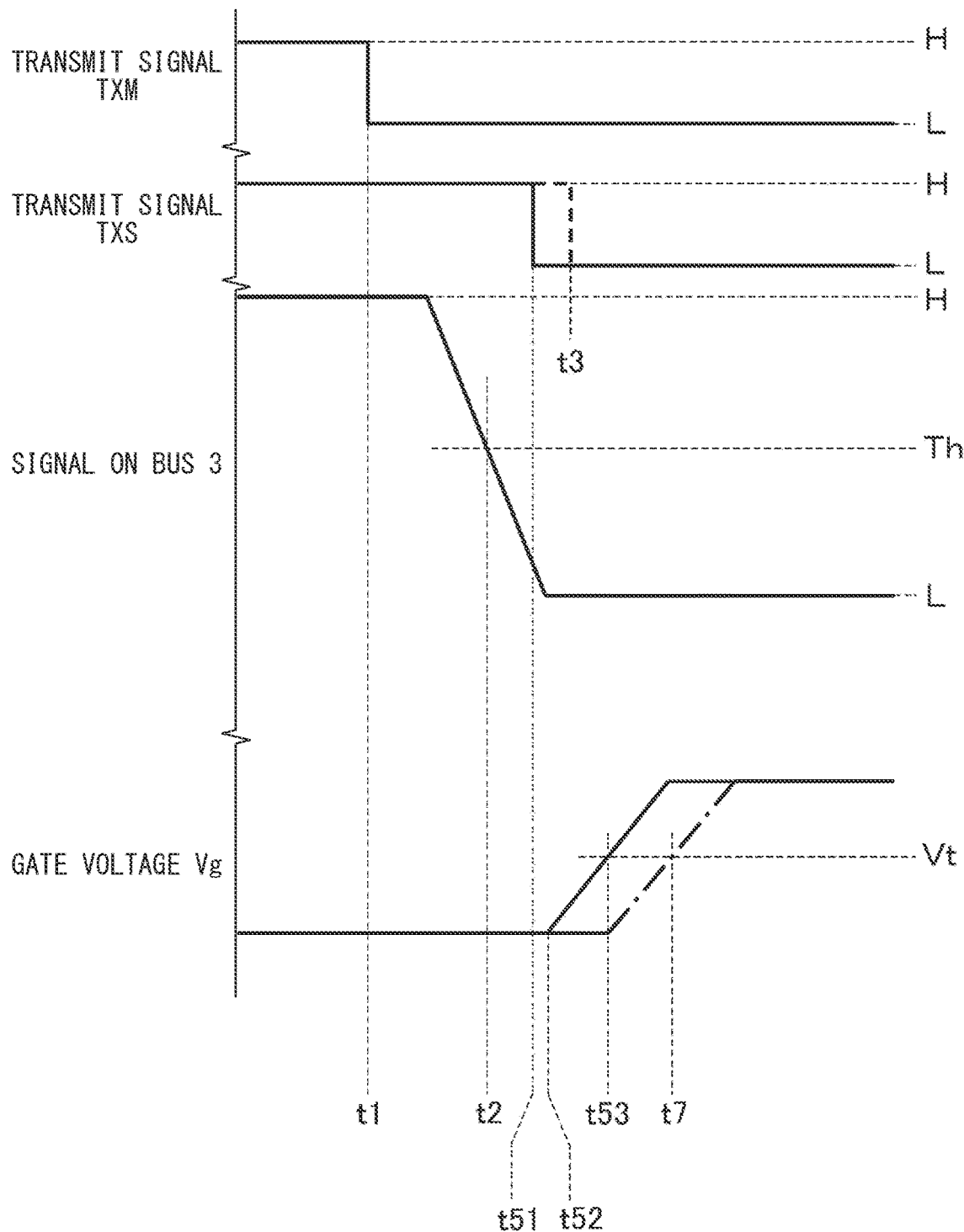
FIG. 13 is a timing chart schematically showing a transmission signal, a bus waveform, and a gate voltage in an operation of the communication apparatus according to the fifth embodiment.

As shown in FIG. 12, the control circuit 53 of the present embodiment includes functions as a learning control sub-circuit 54, which may also referred to as a learning control unit 54, a predictive control sub-circuit 55, which may also be referred to as a predictive control unit 55, and an advance control sub-circuit 56, which may also be referred to as an advance control unit 56. The learning control sub-circuit 54 executes learning control for learning the cycle of the boundary edge based on the detection result of the boundary edge by the receiver circuit 5 functioning as the edge detection circuit. In this case, the learning control sub-circuit 54 includes a counter 54a, which is a hardware timer counter that measures a 1-bit rate. The counter 54a executes the counting operation from the time when the boundary edge is detected to the time when the boundary edge is detected next.

Specifically, the counter 54a starts the counting operation when the boundary edge is detected, and thereafter restarts the counting operation after clearing the count value at each time when the boundary edge is detected. The learning control sub-circuit 54 learns the cycle of the boundary edge based on the count value of the counter 54a. That is, the learning control sub-circuit 54 learns each time the count value when the counter 54a is cleared, as the learning value of the cycle of the boundary edge. Since the bit rate is constant, such a learning value indicates a constant value. For example, when the bit rate is 20 kbps and the counter 54a operates with a system clock of 4.5 MHz, the learning value is constant at "225".

The predictive control sub-circuit 55 executes predictive control for predicting the timing at which the next boundary edge is detected based on the cycle of the boundary edge learned by the learning control sub-circuit 54 executing the learning control. Specifically, the predictive control sub-circuit 55 can predict the timing at which the next boundary edge is detected based on (i) the learning value learned by the learning control and (ii) the current count value of the counter 54a.

The advance control sub-circuit 56 executes the advance control that gives an on-command to the driving circuit 52, that is, a low-level transmission signal TX at a time point before the timing predicted by the prediction control sub-circuit 55 executing the prediction control. Specifically, the advance control sub-circuit 56 starts outputting the low-level transmission signal TX at a time point that is a predetermined number of clocks before the time point when the count value of the counter 54a matches the learning value.

For example, when the bit rate and the system clock are the above-mentioned conditions, the advance control sub-circuit 56 starts outputting the low-level transmission signal TX when the count value of the counter 54a is "220" and reaches the counter match. The setting of the predetermined number of clocks, that is, the setting of how much before the predicted timing to start the output, can be appropriately changed and adjusted according to various specifications and the like.

Although the details will be described later, each of the above-mentioned controls is executed by the learning control sub-circuit 54, the predictive control sub-circuit 55, and the advance control sub-circuit 56. As a result, the delay time required from the boundary edge to the time when the transistor Q1 is turned on is shortened. That is, in this case, the delay shortening sub-circuit 57 is configured by the learning control sub-circuit 54, the predictive control sub-circuit 55, and the advance control sub-circuit 56. As described above, in the present embodiment, the delay shortening sub-circuit 57 is provided in the control circuit 53.

The control circuit 53 generates a cut signal PSCM described above. The cut signal PSCM becomes at a high level in an advance period and at a low level in other periods. The advance period is a period from the time when the output of the low-level transmission signal TX is started by executing the advance control to the time when the next boundary edge predicted by the predictive control is detected.

Next, the operation of the above configuration will be described with reference to the timing chart of FIG. 13.

In this case, the operation of each part during the off period in which the driving circuit 52 performs an off drive to turn the transistor Q1 off is as follows. That is, since the transmission signal TXS is at a high level, the switch S51 is turned off. As a result, the gate-source capacitance of the transistor Q1 is discharged by the current of the current source 12, so that the gate voltage Vg drops and the transistor Q1 is turned off.

In this case, the control circuit 53 executes each of the above-mentioned controls. Thereby, at the time point t51 before the time point t3 at which the control circuit 6 of the first embodiment changes the transmission signal TXS from the high level to the low level, the transmission signal TXS is changed from the high level to the low level. During the period after the time point t51, the transmission signal TXS is at a low level. During such a period, the driving circuit 52 performs the on drive to turn the transistor Q1 on. The operation of each part during the on period in which the driving circuit 52 performs the on drive to turn the transistor Q1 on is as follows.

That is, since the transmission signal TXS is at a low level, the switch S51 is turned on. Further, the cut signal PSCM becomes a high level during the advance period from the time point t51 to the time point t3. Therefore, during the advance period, the output current of the current source 11 branches and flows so as to charge each of the capacitors C1 and C2. After that, when the cut signal PSCM turns to a low level at the time point t3, a current having a current value I2 corresponding to the difference between the output current of the current source 11 and the output current of the current source 12 is supplied toward the gate of the transistor Q1.

Such constant current control is performed. As a result, the gate voltage Vg of the transistor Q1 rises relatively slowly with a constant slope from the time point t52 when a short time has passed from the time point t51. The slope of the rise in the gate voltage Vg at this time is determined by the current values I1 and I2 of the current sources 11 and 12 and the capacitance values of the capacitors C1 and C2. Then, at the time point t53 when the gate voltage Vg of the transistor Q1 reaches the threshold voltage Vt, the transistor Q1 is turned on.

Since the present embodiment described above also includes the delay shortening sub-circuit 57 that shortens the delay time required from the boundary edge to the time when the transistor Q1 is turned on, the same effect as that of the first embodiment can be obtained. In this case, the delay shortening sub-circuit 57 provided in the control circuit 53 executes various controls to switch the transmission signal TX to the low level at a timing ahead of the comparative example corresponding to a known configuration. Therefore, according to the present embodiment, the transmission signal TX may be advanced by setting the timing. It is thus possible to significantly reduce the overall delay time including not only the delay time due to the operation of the driving circuit 52, but also the total delay time including the logic delay in the control circuit 53, the delay in the filter circuit 7, the delay in the comparator 8, and the like.

The driving circuit 52 of the present embodiment is configured to perform the on drive to turn the transistor Q1 on by constant current drive throughout the on period, as in the comparative example described in the first embodiment. Therefore, in the present embodiment, the gate voltage rises relatively slowly to reach the threshold voltage Vt, and the transistor Q1 is turned on. Therefore, according to the present embodiment, it is possible to reduce the risk of deterioration of emissions due to the on operation of the transistor Q1.

Sixth Embodiment

Figure 14:
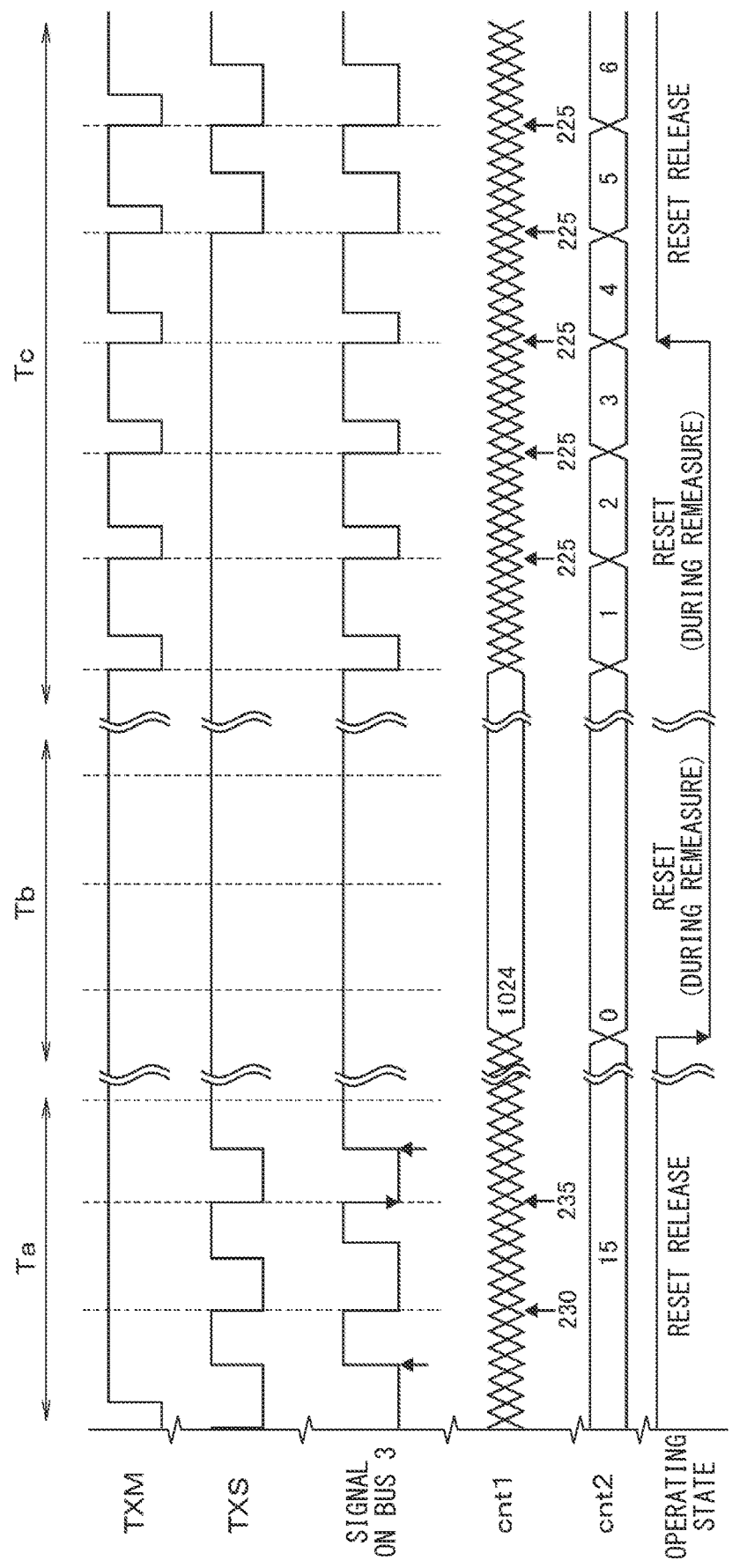
FIG. 14 is a timing chart which shows typically the transmission signal, the bus waveform, the count value, and the operation state of a control circuit in an operation when the bus is fixed at a high level according to a sixth embodiment.

Hereinafter, the sixth embodiment will be described with reference to FIG. 14. In the configuration of the fifth embodiment, the control circuit 53 does not start the output of the low-level transmission signal TXS with the change of the signal on the bus 3 as a trigger. The output of the low-level transmission signal TXS is started in advance based on the learned value of the learned cycle of the boundary edge, and does not wait for the change of the signal on the bus 3. That is, even if the clock is not output from the master 2m, the control circuit 53 starts to output the low-level transmission signal TXS when the dominant code is output.

Therefore, the following problem may occur in the configuration of the fifth embodiment. That is, suppose a case where the clock supply is stopped due to some abnormality on the master 2m side and the bus 3 is fixed to at a high level. In such a case, the control circuit 53 may output a low-level transmission signal TXS based on the learning value, that is, may change the signal level on the bus 3 and behave as if a clock from the master 2m is supplied. Therefore, in the configuration of the fifth embodiment, even if the bus 3 is fixed to at a high level, the slave 2s may run by itself when continuously outputting the dominant code. In the following, the fixing of the bus 3 to at a high level is referred to as Hi fixing.

Therefore, in the present embodiment, the following changes are made to the control content of the control circuit 53 to prevent the occurrence of such a problem. First, in CXPI communication, a UART frame is decoded and a signal is put on the bus 3. The UART always contains at least one stop bit. Therefore, in the operation of the slave 2s, the timing of outputting the recessive code corresponding to "logical value: 1" to the bus 3 is always included.

When the slave 2s outputs the recessive code corresponding to the stop bit in the state where the bus 3 is Hi fixing, the boundary edge is not detected for a relatively long period. Therefore, the count value of the counter 54a is much larger than the value assumed as the cycle of the boundary edge (for example, "225"). Therefore, when the count value of the counter 54a reaches an upper limit value (for example, "1024") larger than the value assumed as the cycle of the boundary edge, the control circuit 53 resets the learning result by the learning control once and executes the learning control gain.

Then, the control circuit 53 is provided to stop the execution of the predictive control and the advance control during the period up to when the learning result by the learning control is obtained. In the present embodiment, the control circuit 53 includes a remeasurement counter that counts the number of times the learning value is correctly obtained. The control circuit 53 stops the execution of the prediction control and the advance control during the period up to when the count value of the remeasurement counter becomes "3", that is, the period up to when the learning value is obtained three times.

Next, the operation when the bus 3 is Hi fixing due to an abnormality on the master 2m side or the like will be described with reference to the timing chart of FIG. 14. In FIG. 14, the count value of the counter 54a is cnt1 and the count value of the remeasurement counter is cnt2. In the period Ta, the slave 2s is in a state of continuously outputting the dominant code. Therefore, even though the clock supply is stopped from the master 2m, the slave 2s outputs the low-level transmission signal TXS based on the learning value, that is, changes the signal level on the bus 3. At this time, the signal on the bus 3 is changed from the high level to the low level by the slave 2s in a cycle close to the cycle of the boundary edge. Therefore, the count value cnt1 is "230", "235", or the like, and is not a value significantly different from the value assumed as the cycle of the boundary edge.

In the period Tb, the slave 2s is in a state of outputting a recessive code corresponding to, for example, a stop bit. Therefore, the count value cnt1 of the counter 54a rises beyond the value assumed as the cycle of the boundary edge, and reaches the upper limit value "1024". As a result, the control circuit 53 temporarily resets the learning result of the learning control, executes the learning control again, and stops the execution of the predictive control and the advance control. In FIG. 14, such an operating state is represented as a reset operation (during remeasurement). At this time, the count value of the remeasurement counter is cleared to "0".

At the start of the period Tc after the period Tb, when the Hi sticking on the bus 3 is resolved by eliminating the abnormality on the master 2m side, the clock supply is restarted from the master 2m. As a result, the learning value starts to be normally obtained by the learning control, and when the learning value is obtained three times, the control circuit 53 resumes the execution of the predictive control and the advance control. As a result, the slave 2s is in a normal operating state in which the slave 2s operates in synchronization with the clock from the master 2m. In FIG. 14, such an operating state is represented as a reset release operation.

According to the present embodiment described above, even if the bus 3 is Hi fixing due to an abnormality on the master 2m side, the control circuit 53 determines that the bus 3 is Hi fixing when the count value of the counter 54a reaches the upper limit, and stop the execution of the predictive control and the execution of the advance control. Therefore, there is no possibility that the slave 2s will continue operating without synchronizing with the clock supplied from the master 2m. Further, in this case, when the control circuit 53 determines that the bus 3 is Hi fixing, the control circuit 53 resets the learning value and restarts the learning control. When the learned value is correctly obtained by the restarted learning control, the prediction control and the advance control are restarted. Therefore, the slave 2s can promptly resume the prediction control and the advance control when the abnormality on the master 2m side is resolved. It is thus possible to return to normal operation.

Other Embodiments

The present disclosure is not limited to the embodiments that have been described above and illustrated in the drawings, but can arbitrarily be modified, combined, or expanded without departing from the spirit of the present disclosure. The numerical values and the like shown in the embodiments described above are examples, and are not limited to those examples.

The present disclosure is not limited to the communication apparatus 2 and 41 that performs CXPI communication exemplified in each of the above embodiments. The present disclosure may be applied to any communication apparatus being one of a plurality of communication apparatuses included in a communication system in which one of the plurality of communication apparatuses transmits data via a transmission path in synchronization with communication by another one of the plurality of communication apparatuses.

The switching element provided in the output stage of the driver circuit 4 or the like may not be limited to a MOS transistor such as the transistor Q1. For example, various semiconductor switching elements such as bipolar transistors and GaAs-MESFETs can be used.

Although the present disclosure has been described in accordance with embodiments, it is understood that the present disclosure is not limited to such embodiments or structures. The present disclosure incorporates various modifications and variations within the scope of equivalents. In addition, various combinations and forms, and further, other combinations and forms including only one element, or more or less than these elements are also within the sprit and the scope of the present disclosure.

For reference to further explain features of the present disclosure, the description is added as follows.

There is known an in-vehicle communication method mounted on a vehicle, such as CXPI in which a slave transmits data in synchronization with the communication by a master. CXPI is an abbreviation for Clock Extension Peripheral Interface. There is disclosed a technology in such a communication, which speeds up the operation of the driver circuit when changing the signal level on the transmission path from a recessive level that is a signal level recessive on the transmission path to a dominant level that is a signal level dominant on the transmission path.

Such a communication is preferable to shorten, as short as possible, the delay time from when the edge of the clock is generated by the master to when the signal level of the transmission path is changed from the recessive level to the dominant level, so as to satisfy the communication protocol. In contrast, there is requested a noise countermeasure to insert a filter circuit in front of the reception buffer. However, if such a filter circuit is inserted, the delay time becomes long due to the influence of the filter circuit, posing a possibility that the communication protocol cannot be satisfied.

It is thud desired for the present disclosure to provide a communication apparatus capable of shortening a delay time.

Aspects of the present disclosure described herein are set forth in the following clauses.

According to an aspect of the present disclosure, a communication apparatus is provided as one of a plurality of communication apparatuses included in a communication system in which a first one of the plurality of communication apparatuses transmits data via a transmission path in synchronization with communication by a second one of the plurality of communication apparatuses. The communication apparatus includes an edge detection circuit, a switching element, a driving circuit, and a control circuit. The edge detection circuit is configured to detect an edge at which a signal level on a transmission path changes from a recessive level that is a signal level recessive on the transmission path to a dominant level that is a signal level dominant on the transmission path. The switching element is capable of setting the signal level on the transmission path to the dominant level by being turned on. The driving circuit is configured to drive the switching element. The control circuit is configured to control an operation of the driving circuit and give an on command that instructs the driving circuit to perform an on drive to turn the switching element on in response to the edge being detected by the edge detection circuit.

The above configuration further includes a delay shortening sub-circuit that is provided in the driving circuit or the control circuit to shorten a delay time from when the edge is detected to when the switching element is turned ON. Therefore, according to the above configuration, the delay time can be shortened, and the communication protocol can be sufficiently satisfied even when a filter circuit is inserted in front of a receive buffer.

According to a first optional aspect, the communication apparatus of the above aspect of the present disclosure is provided as follows. The delay shortening sub-circuit is provided in the driving circuit. Herein, the delay shortening sub-circuit is further configured to shorten the delay time by performing a voltage control to increase a control voltage, which is a voltage of a control terminal of the switching element, to a first voltage that is a predetermined value lower than a threshold voltage at which the switching element is turned on, in a period including a start time of an on period in which the driving circuit performs the on drive of the switching element, to thereby reduce the delay time.

For example, in a known configuration in which a switching element is subject to the on drive by a constant current drive throughout the on period, the control voltage of the switching element rises relatively slowly with a constant slope throughout the on period. Therefore, in the known configuration described above, it takes a relatively long time for the control voltage to reach the threshold voltage and the switching element to turn on. As a result, the delay time due to the operation of the driving circuit may become long. On the other hand, in the configuration according to the first optional aspect, by performing the voltage control described above, the control voltage of the switching element rises to the first voltage at one time relatively steeply in the period including the start time of the on period.

In the above configuration, after the control voltage rises to the first voltage by performing such a voltage control, the voltage control such as a constant current control may be performed. As a result, the control voltage reaches the threshold voltage and the switching element turns on. According to such a configuration, the turn-on period of the switching element, that is, the delay time due to the operation of the driving circuit can be shortened by at least the amount that the control voltage is raised to the first voltage at one time as compared with the known configuration described above.

According to a second optional aspect, the communication apparatus of the above aspect of the present disclosure is provided as follows. The driving circuit provided with the delay shortening sub-circuit is further configured to perform a constant current control for supplying a constant current to the control terminal of the switching element after the control voltage is increased to the first voltage by performing the voltage control.

According to such a configuration, after the control voltage of the switching element rises to the first voltage, it rises relatively gently with a constant slope and reaches the threshold voltage. When the control voltage rises sharply and reaches the threshold voltage and the switching element is turned on, there is a concern that the emission may deteriorate due to the on operation. However, according to the above configuration, since the control voltage rises relatively slowly to reach the threshold voltage and the switching element is turned on, the risk of such emission deterioration may be reduced.

What is claimed is:

1. A communication apparatus being one of a plurality of communication apparatuses included in a communication system in which a first one of the plurality of communication apparatuses transmits data via a transmission path in synchronization with communication by a second one of the plurality of communication apparatuses, the communication apparatus comprising:

an edge detection circuit configured to detect an edge at which a signal level on the transmission path changes from a recessive level that is a signal level recessive on the transmission path to a dominant level that is a signal level dominant on the transmission path;

a switching element capable of setting the signal level on the transmission path to the dominant level by being turned on;

a driving circuit configured to drive the switching element;

a control circuit configured to control an operation of the driving circuit and give an on command that instructs the driving circuit to perform an on drive to turn the switching element on in response to the edge being detected by the edge detection circuit; and a delay shortening sub-circuit provided in the driving circuit to shorten a delay time from when the edge is detected to when the switching element is turned on, wherein:

the delay shortening sub-circuit is further configured to shorten the delay time by performing a voltage control to increase a control voltage, which is a voltage of a control terminal of the switching element, to a first voltage that is a predetermined value lower than a threshold voltage at which the switching element is turned on, in a period including a start time of an on period in which the driving circuit performs the on drive of the switching element.

2. The communication apparatus according to claim 1, wherein:

the driving circuit provided with the delay shortening sub-circuit is further configured to perform a constant current control for supplying a constant current to the control terminal of the switching element after the control voltage is increased to the first voltage by performing the voltage control.

3. The communication apparatus according to claim 1, wherein:

the driving circuit provided with the delay shortening sub-circuit is further configured to continue the voltage control to increase the voltage of the control terminal to a second voltage higher than the threshold voltage after the control voltage is increased to the first voltage by performing the voltage control.

4. The communication apparatus according to claim 3, wherein:

the delay shortening sub-circuit provided in the driving circuit includes a filter circuit interposed in series with a supply path of the second voltage to the control terminal of the switching element.

5. A communication apparatus being one of a plurality of communication apparatuses included in a communication system in which a first one of the plurality of communication apparatuses transmits data via a transmission path in synchronization with communication by a second one of the plurality of communication apparatuses, the communication apparatus comprising:

an edge detection circuit configured to detect an edge at which a signal level on the transmission path changes from a recessive level that is a signal level recessive on the transmission path to a dominant level that is a signal level dominant on the transmission path;

a switching element capable of setting the signal level on the transmission path to the dominant level by being turned on;

a driving circuit configured to drive the switching element;

a control circuit configured to control an operation of the driving circuit and give an on command that instructs the driving circuit to perform an on drive to turn the switching element on in response to the edge being detected by the edge detection circuit;

a delay shortening sub-circuit provided in the driving circuit or the control circuit to shorten a delay time from when the edge is detected to when the switching element is turned on;

a determination sub-circuit configured to determine a code transmitted via the transmission path by sampling a signal on the transmission path at a predetermined sampling timing; and a noise detection sub-circuit configured to detect a signal level on the transmission path and detect a noise superimposed on the transmission path based on a detection result, wherein:

the determination sub-circuit is further configured to delay the sampling timing by a predetermined time according to a period in which the noise is detected in response to the noise being detected by the noise detection sub-circuit.

6. A communication apparatus being one of a plurality of communication apparatuses included in a communication system in which a first one of the plurality of communication apparatuses transmits data via a transmission path in synchronization with communication by a second one of the plurality of communication apparatuses, the communication apparatus comprising:

an edge detection circuit configured to detect an edge at which a signal level on the transmission path changes from a recessive level that is a signal level recessive on the transmission path to a dominant level that is a signal level dominant on the transmission path;

a switching element capable of setting the signal level on the transmission path to the dominant level by being turned on;

a driving circuit configured to drive the switching element;

a control circuit configured to control an operation of the driving circuit and give an on command that instructs the driving circuit to perform an on drive to turn the switching element on in response to the edge being detected by the edge detection circuit; and a delay shortening sub-circuit provided in the control circuit to shorten a delay time from when the edge is detected to when the switching element is turned on, wherein:

the delay shortening sub-circuit is further configured to shorten the delay time by executing a learning control that learns a cycle of the edge based on a detection result by the edge detection circuit, a predictive control that predicts a timing at which the edge is next detected based on the cycle of the edge learned by the learning control, and an advance control that gives the on command to the driving circuit at a time before the timing predicted by the predictive control.

7. The communication apparatus according to claim 6, wherein:

the delay shortening sub-circuit includes a counter that executes a counting operation to count a count value from when the edge is detected by the edge detection circuit to when the edge is next detected by the edge detection circuit; and the delay shortening sub-circuit is further configured to learn the cycle of the edge based on the count value by the counter in the learning control, reset once a learning result by the learning control and execute the learning control again in response to the count value of the counter reaching an upper limit value larger than a value assumed as the cycle of the edge, and
stop executions of the predictive control and the advance control in a period to when the learning result by the learning control is obtained.

\* \* \* \* \*